US012563731B2

(12) United States Patent
Choi

(10) Patent No.: US 12,563,731 B2
(45) Date of Patent: Feb. 24, 2026

(54) SEMICONDUCTOR DEVICES AND DATA STORAGE SYSTEMS INCLUDING THE SAME

(71) Applicant: Samsung Electronics Co., Ltd., Suwon-si (KR)

(72) Inventor: Hyunmook Choi, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 644 days.

(21) Appl. No.: 18/058,014

(22) Filed: Nov. 22, 2022

(65) Prior Publication Data

US 2023/0284449 A1 Sep. 7, 2023

(30) Foreign Application Priority Data

Mar. 3, 2022 (KR) ........................ 10-2022-0027592

(51) Int. Cl.
| | |
|---|---|
| *H10B 43/27* | (2023.01) |
| *H01L 23/528* | (2006.01) |
| *H10B 41/10* | (2023.01) |
| *H10B 41/27* | (2023.01) |
| *H10B 41/35* | (2023.01) |
(Continued)

(52) U.S. Cl.
CPC ......... *H10B 43/27* (2023.02); *H01L 23/5283* (2013.01); *H10B 41/10* (2023.02); *H10B 41/27* (2023.02); *H10B 41/35* (2023.02); *H10B 43/10* (2023.02); *H10B 43/35* (2023.02)

(58) Field of Classification Search
CPC ......... H01L 23/53214–53219; H01L 23/5283; H10B 43/20–27; H10B 41/20–27
See application file for complete search history.

(56) References Cited

U.S. PATENT DOCUMENTS

| | | | |
|---|---|---|---|
| 8,445,347 | B2 | 5/2013 | Alsmeier |
| 9,449,981 | B2 | 9/2016 | Pachamuthu et al. |
| 9,960,178 | B2 | 5/2018 | Kawai et al. |
(Continued)

FOREIGN PATENT DOCUMENTS

KR 2003/0050906 A 6/2003

OTHER PUBLICATIONS

Office Action in Korean Appln. No. 10-2022-0027592, mailed on Aug. 21, 2025, 23 pages (with English translation).

*Primary Examiner* — Amar Movva
(74) *Attorney, Agent, or Firm* — Fish & Richardson P.C.

(57) ABSTRACT

A semiconductor device may include a lower interconnection structure electrically connected to circuit devices on a first substrate, a lower bonding structure connected to the lower interconnection structure and an upper bonding structure, an upper interconnection structure connected to the upper bonding structure, a second substrate on the upper interconnection structure, gate electrodes between the upper interconnection structure and the second substrate, channel structures penetrating through the gate electrodes. The gate electrodes may be spaced apart from each other in a vertical direction. The gate electrodes may include first and second gate electrodes. Each of the channel structures may include a channel layer, which may include a first semiconductor material layer adjacent to the first gate electrodes and a second semiconductor material layer adjacent to the second gate electrodes. Each of the first and second semiconductor material layers may have a single crystal structure or a single crystal-like structure.

20 Claims, 25 Drawing Sheets

(51) Int. Cl.
  *H10B 43/10*        (2023.01)
  *H10B 43/35*        (2023.01)

(56)        References Cited

U.S. PATENT DOCUMENTS

| | | | |
|---|---|---|---|
| 10,572,380 | B2 | 2/2020 | Li et al. |
| 10,615,170 | B2 | 4/2020 | Maeda et al. |
| 2003/0113957 | A1 | 6/2003 | So |
| 2015/0004777 | A1 | 1/2015 | Kohji et al. |
| 2021/0011633 | A1 | 1/2021 | Kim |
| 2021/0272809 | A1 | 9/2021 | Matsubara |
| 2021/0408031 | A1 | 12/2021 | Sharangpani et al. |

A

B

B

C

D

D

SEMICONDUCTOR DEVICES AND DATA STORAGE SYSTEMS INCLUDING THE SAME

CROSS-REFERENCE TO RELATED APPLICATION(S)

This application claims benefit of priority to Korean Patent Application No. 10-2022-0027592, filed on Mar. 3, 2022 in the Korean Intellectual Property Office, the disclosure of which is incorporated herein by reference in its entirety.

BACKGROUND

The present disclosure relates to semiconductor devices and data storage systems including the same.

In a data storage system requiring data storage, there is increasing demand for a semiconductor device which may store high-capacity data. Accordingly, research into methods of increasing data storage capacity of a semiconductor device has been conducted. For example, a semiconductor device including three-dimensionally arranged memory cells, rather than two-dimensionally arranged memory cells, has been proposed as a method of increasing data storage capacity of a semiconductor device.

SUMMARY

Example embodiments provide a semiconductor device having improved electrical characteristics.

Example embodiments provide a data storage system including a semiconductor device having improved electrical characteristics.

According to an example embodiment, a semiconductor device may include a first semiconductor structure including a first substrate, a plurality of circuit devices on the first substrate, a lower interconnection structure electrically connected to the plurality of circuit devices, and a lower bonding structure connected to the lower interconnection structure; and a second semiconductor structure including a second substrate on the first semiconductor structure, a stack structure below the second substrate and including a plurality of gate electrodes and a plurality interlayer insulating layers alternately stacked in a vertical direction, and a plurality of channel structures penetrating through the stack structure and extending in the vertical direction, an upper interconnection structure below the stack structure, and an upper bonding structure connected to the upper interconnection structure and bonded to the lower bonding structure. The vertical direction may be perpendicular to the second substrate. Each of the plurality of channel structures may include a channel layer. The stack structure may include a first stack structure and a second stack structure below the first stack structure. The plurality of channel structures each may include a first channel structure and a second channel structure. The first channel structure may penetrate through the first stack structure. The second channel structure may penetrate through the second stack structure. The plurality of channel structures each may further include a metal-semiconductor compound layer in a region of the channel structure adjacent to a boundary between the first channel structure and the second channel structure.

According to an example embodiment, a semiconductor device may include a first substrate; a plurality of circuit devices on the first substrate; a lower interconnection structure electrically connected to the plurality of circuit devices;

a lower bonding structure connected to the lower interconnection structure; an upper bonding structure bonded to the lower bonding structure; an upper interconnection structure connected to the upper bonding structure; a second substrate on the upper interconnection structure; a plurality of gate electrodes between the upper interconnection structure and the second substrate; and a plurality of channel structures penetrating through the plurality of gate electrodes. The plurality of gate electrodes may be spaced apart from each other and stacked in a vertical direction. The plurality of gate electrodes may include a plurality of first gate electrodes and a plurality of second gate electrodes below the plurality of first gate electrodes. Each of the plurality of channel structures may include a channel layer. The channel layer may include a first semiconductor material layer adjacent to the plurality of first gate electrodes and a second semiconductor material layer adjacent to the plurality of second gate electrodes. Each of the first semiconductor material layer and the second semiconductor material layer may have a single crystal structure or a single crystal-like structure.

According to an example embodiment, a data storage system may include a semiconductor storage device and a controller. The semiconductor storage device may include a first substrate, a plurality of circuit devices on the first substrate, a lower interconnection structure electrically connected to the plurality of circuit devices, a lower bonding structure connected to the lower interconnection structure, an upper bonding structure bonded to the lower bonding structure, an upper interconnection structure connected to the upper bonding structure, a second substrate on the upper interconnection structure, a plurality of gate electrodes between the upper interconnection structure and the second substrate, a plurality of channel structures penetrating through the plurality of gate electrodes, and input/output pads electrically connected to the plurality of circuit devices. The controller may be electrically connected to the semiconductor storage device through the input/output pads. The controller may be configured to control the semiconductor storage device. The plurality of gate electrodes may be spaced apart from each other and stacked in a vertical direction. The plurality of gate electrodes may include a plurality of first gate electrodes and a plurality of second gate electrodes below the plurality of first gate electrodes. Each of the channel structures may include a channel layer. The channel layer may include a first semiconductor material layer adjacent to the plurality of first gate electrodes and a second semiconductor material layer adjacent to the plurality of second gate electrodes. Each of the first semiconductor material layer and the second semiconductor material layer may have a single crystal structure or a single crystal-like structure.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," and similar language (e.g., "at least one selected from the group consisting of A, B, and C") may be construed as A only, B only, C only, or any combination of two or more of A, B, and C, such as, for instance, ABC, AB, BC, and AC.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Hereinafter, example embodiments will be described with reference to the accompanying drawings.

Figure 1:
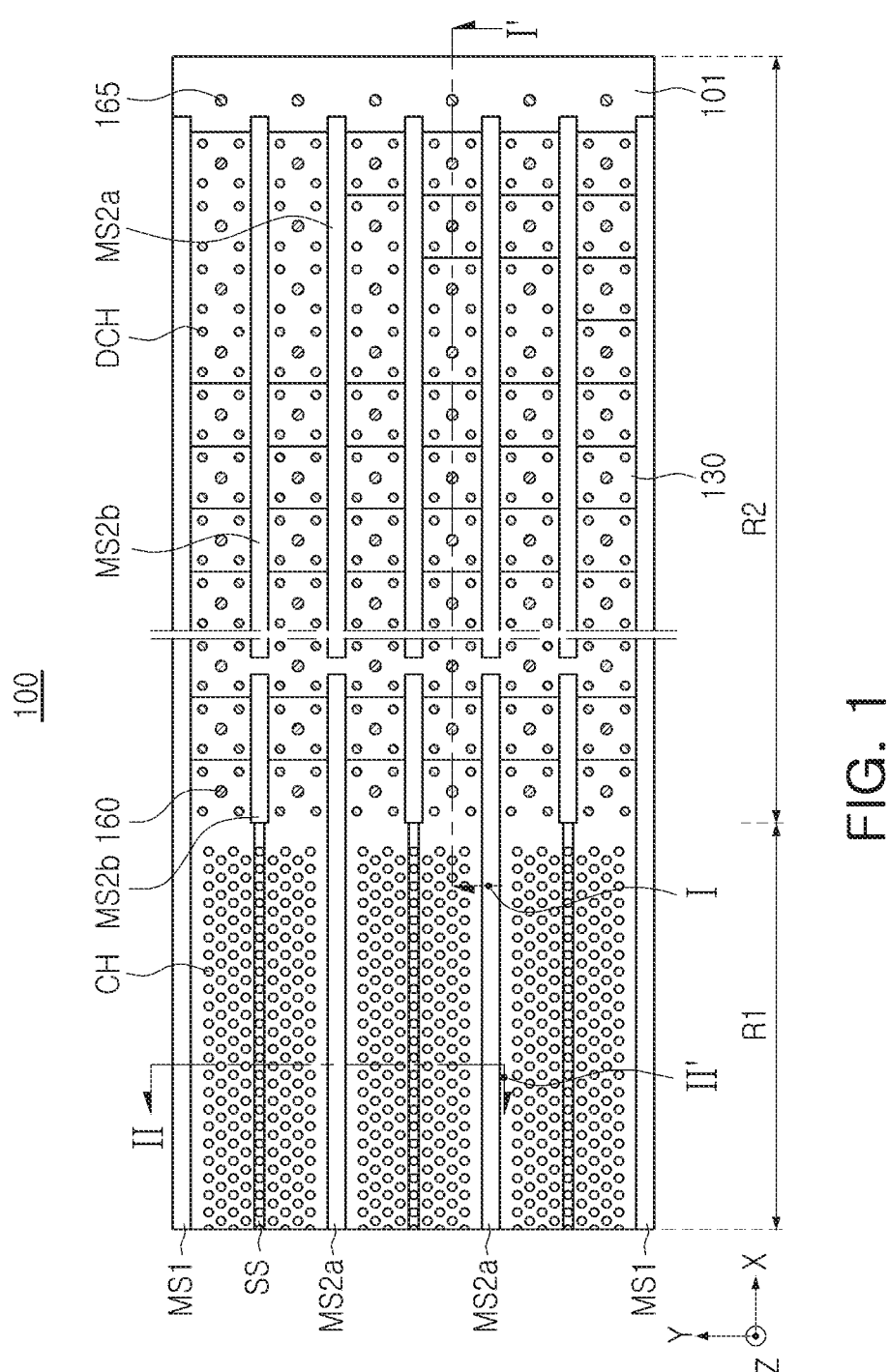
FIG. 1 is a schematic plan view of a semiconductor device according to example embodiments.

FIG. 1 is a schematic plan view of a semiconductor device according to example embodiments.

Figure 2A:
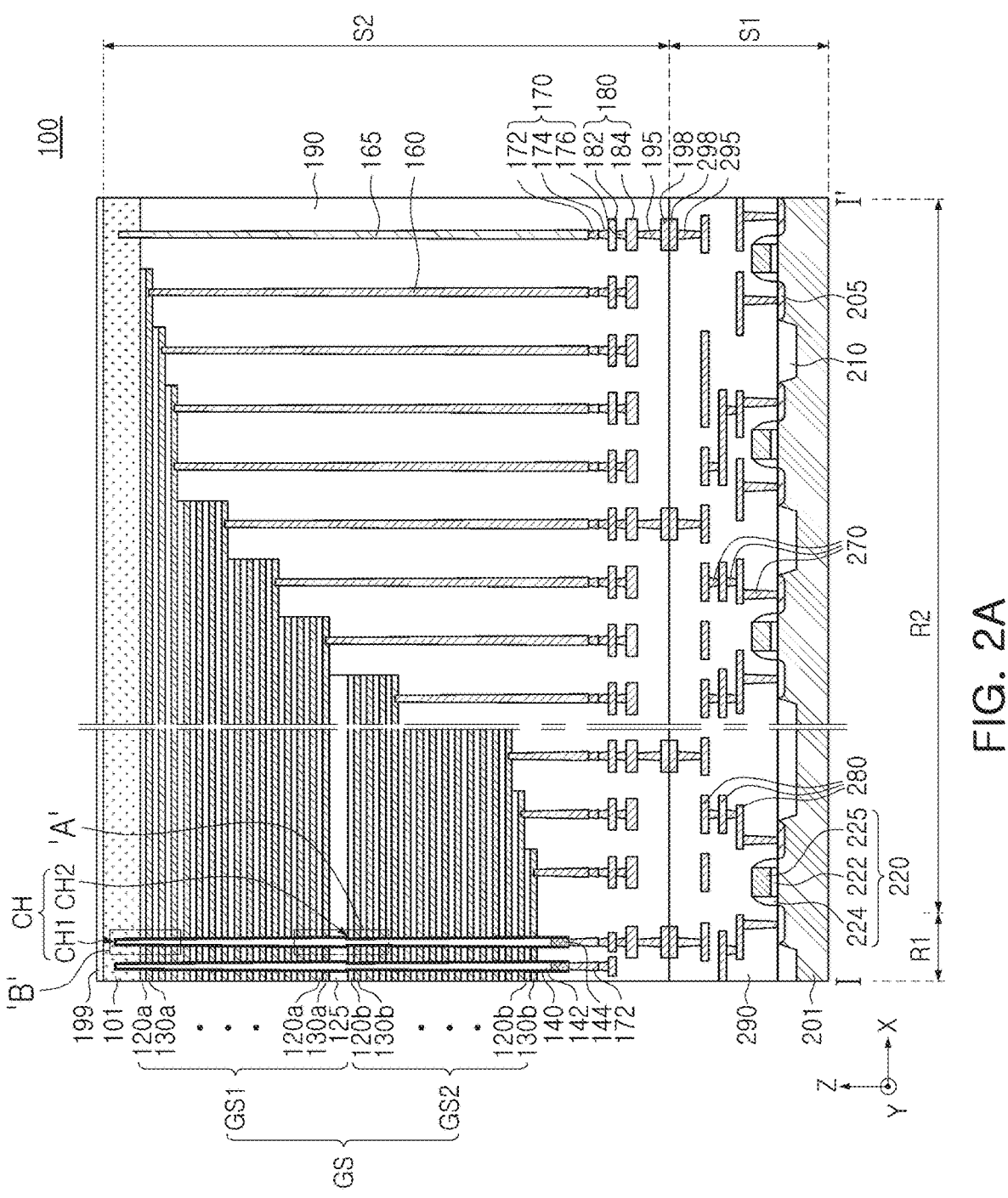
FIGS. 2A and 2B are schematic cross-sectional views of a semiconductor device according to example embodiments.
Figure 2B:
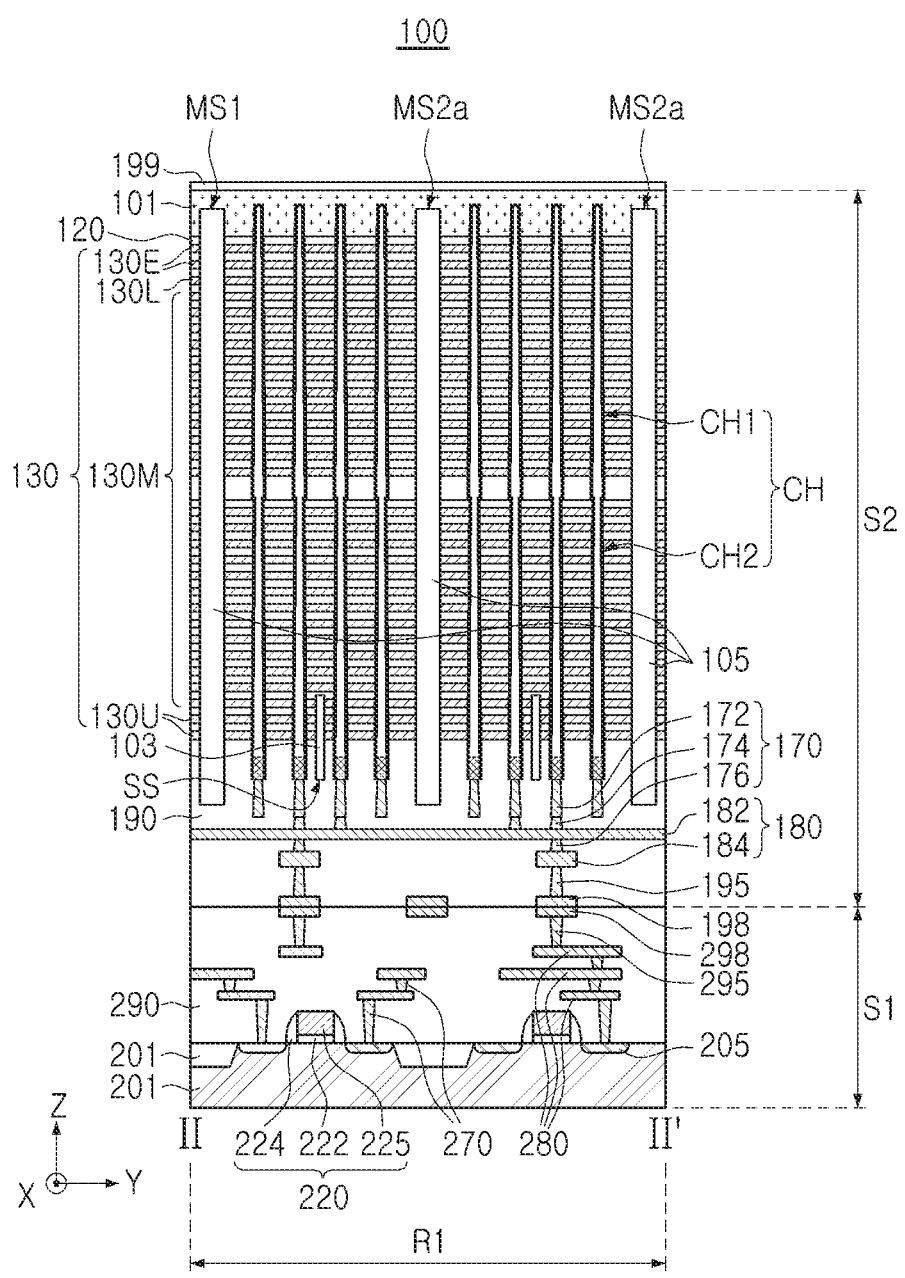

FIGS. 2A and 2B are schematic cross-sectional views of a semiconductor device according to example embodiments. FIG. 2A is a cross-sectional view taken along line I-I' of FIG. 1, and FIG. 2B is a cross-sectional view taken along line II-IT of FIG. 1

Figure 3A:
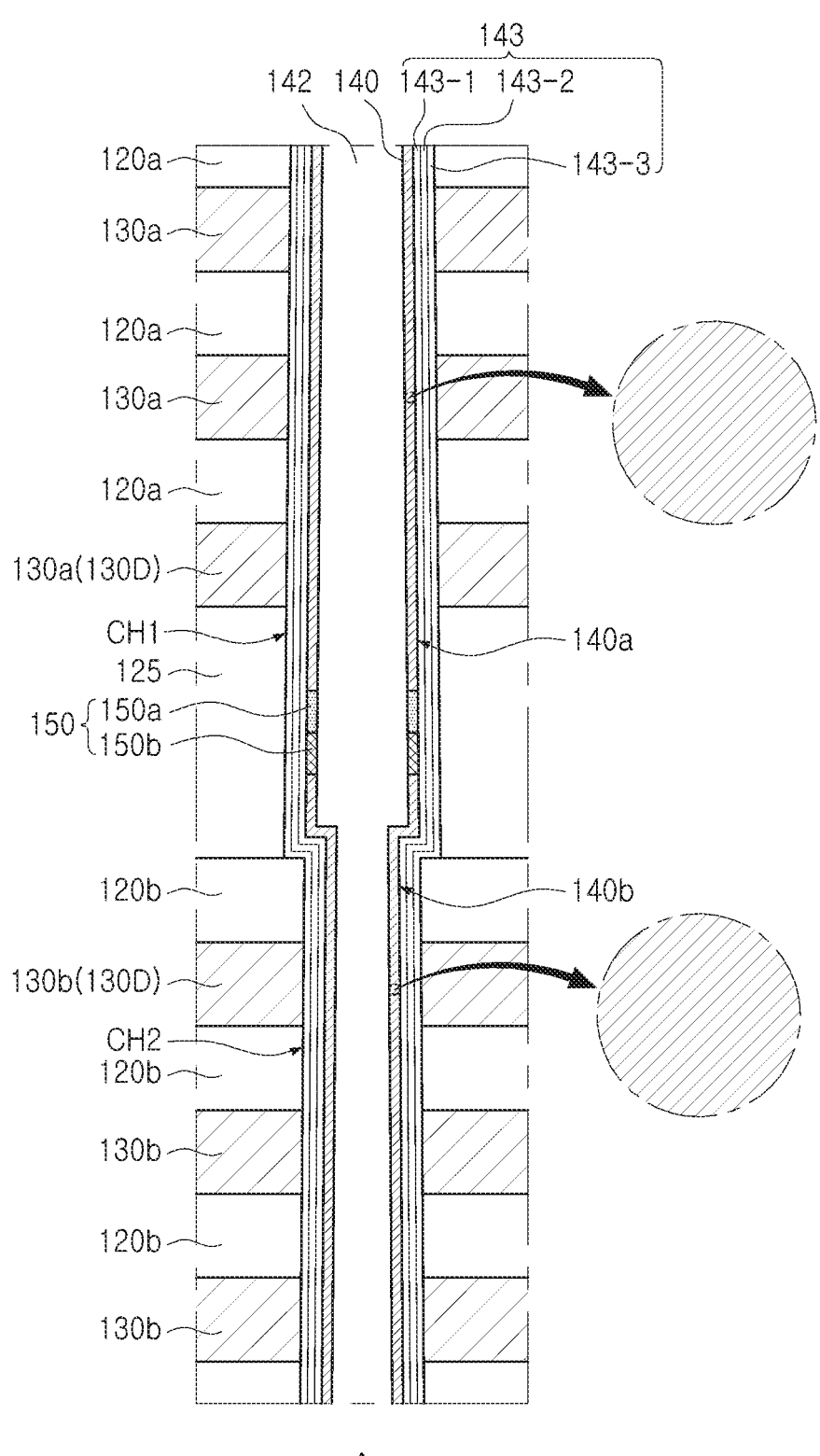
FIGS. 3A and 3B are partially enlarged views of a semiconductor device according to example embodiments.
Figure 3B:
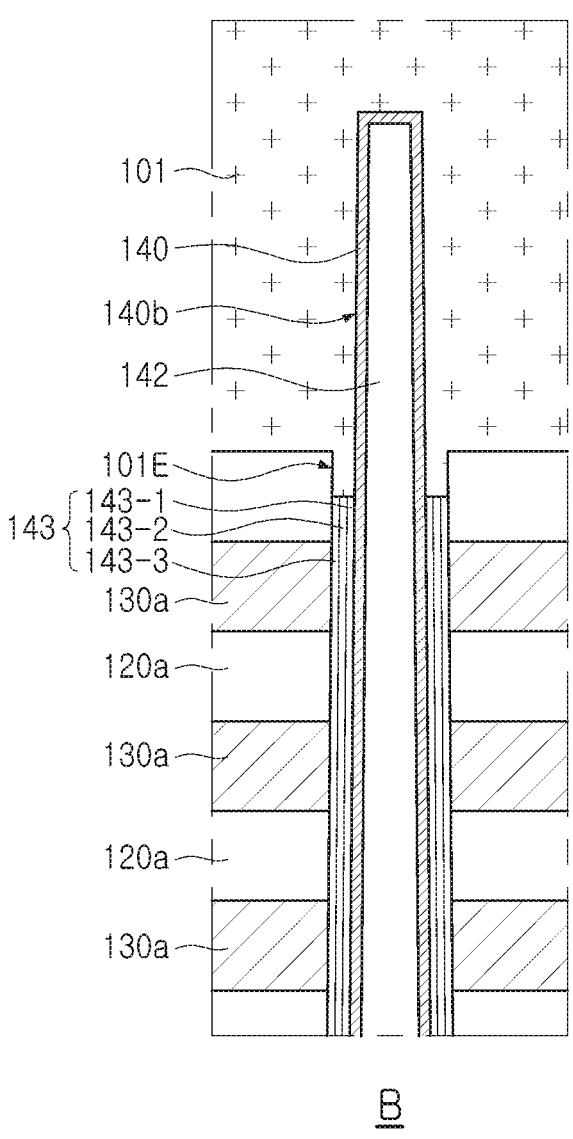

FIGS. 3A and 3B are partially enlarged views of a semiconductor device according to example embodiments. FIG. 3A is an enlarged view of region "A" of FIG. 2A, and FIG. 3B is an enlarged view of region "B" of FIG. 2A.

Referring to FIGS. 1 to 3B, a semiconductor device 100 may include first and second semiconductor structures S1 and S2 vertically stacked. For example, the first semiconductor structure S1 may include a peripheral circuit region of the semiconductor device 100, and the second semiconductor structure S2 may include a memory cell region of the semiconductor device 100. FIG. 1 illustrates a plane in a direction in which the second structure S2 is viewed from a boundary between the first and second semiconductor structures S1 and S2.

The first semiconductor structure S1 may include a first substrate 201, source/drain regions 205 and device isolation layers 210 in the first substrate 201, circuit devices 220 disposed on the substrate 201, circuit contact plugs 270, circuit interconnection lines 280, a peripheral region insulating layer 290, first bonding vias 295, and first bonding metal layers 298.

The first substrate 201 may have an upper surface extending in an X-direction and a Y-direction. The device isolation layers 210 may be formed on the first substrate 201 to define an active region. The source/drain regions 205 including impurities may be disposed in a portion of the active region. The first substrate 201 may include a semiconductor material, for example, a group IV semiconductor, a group III-V compound semiconductor, or a group II-VI compound semiconductor. For example, the first substrate 201 may be provided as a single crystal bulk wafer.

The circuit devices 220 may include planar transistors. Each of the circuit devices 220 may include a circuit gate dielectric layer 222, a spacer layer 224, and a circuit gate electrode 225. Source/drain regions 205 may be disposed in the substrate 201 on opposite sides adjacent to the circuit gate electrode 225.

A peripheral region insulating layer 290 may be disposed on the substrate 201 to cover the circuit devices 220. The circuit contact plugs 270 and the circuit interconnection lines 280 may constitute a lower interconnection structure of the first semiconductor structure S1. The circuit contact plugs 270 may have a cylindrical shape and may penetrate through the peripheral region insulating layer 290 to be connected to the source/drain regions 205. Electrical signals may be applied to the circuit devices 220 by the circuit contact plugs 270. In a region not illustrated, circuit contact plugs 270 may also be connected to the circuit gate electrode 225. The circuit interconnection lines 280 may be connected to the circuit contact plugs 270, may have a line shape, and may be disposed as a plurality of layers. The number of layers of the circuit contact plugs 270 and the circuit interconnection lines 280 may vary according to example embodiments.

The first bonding vias 295 and the first bonding metal layers 298 may constitute a lower bonding structure and may be disposed on a portion of uppermost circuit interconnection lines 280. The lower bonding structure may be connected to the lower interconnection structure. Each of the first bonding vias 295 may have a cylindrical shape, and the first bonding metal layers 298 may have a circular pad shape or a relatively short line shape in a plane. Upper surfaces of the first bonding metal layers 298 may be exposed to upper surface of the first semiconductor structure S1. The first bonding vias 295 and the first bonding metal layers 298 may function as a bonding structure or a bonding layer of the first semiconductor structure S1 and the second semiconductor structure S2. In addition, the first bonding vias 295 and the first bonding metal layers 298 may provide an electrical connection path with the second semiconductor structure S2. In example embodiments, some of the first bonding metal layers 298 may not be connected to the lower circuit interconnection lines 280 and may be disposed only for bonding, as illustrated in FIG. 2B. The first bonding vias 295 and the first bonding metal layers 298 may include a conductive material, for example, copper (Cu).

In example embodiments, the peripheral region insulating layer 290 may include a bonding insulating layer having a desired and/or alternatively predetermined thickness from an upper surface thereof. The bonding insulating layer may be a layer for dielectric-to-dielectric bonding to a bonding insulating layer of the second semiconductor structure S2. The bonding insulating layer may also function as a diffusion barrier layer of the first bonding metal layers 298, and may include at least one of, for example, SiO, SiN, SiCN, SiOC, SiON, and SiOCN.

The second semiconductor structure S2 may include a second substrate 101 having a first region R1 and a second region R2, a gate stack structure GS including gate electrodes 130 stacked on a lower surface of the second substrate 101 and interlayer insulating layers 120 stacked alternately with the gate electrodes 130, channel structures CH disposed to penetrate through the stack structure GS, and first and second separation regions MS1, MS2a, and MS2b extending in one direction through the stack structure GS. The second semiconductor structure S2 may further include insulating regions SS penetrating through a portion of the gate electrodes 130, a cell region insulating layer 190 covering the gate electrodes 130, and a passivation layer 199 on the second substrate 101. The second semiconductor structure S2 may include gate contacts 160, a substrate contact 165, cell contact plugs 170, and cell interconnection lines 180, disposed below the gate electrodes 130 and the channel structures CH, as a second interconnection structure. As an upper bonding structure, the second semiconductor structure S2 may further include second bonding vias 195 and second bonding metal layers 198.

The second substrate 101 may have an upper surface extending in the X-direction and the Y-direction. The substrate 101 may include a semiconductor material, for example, a group IV semiconductor, a group III-V compound semiconductor, or a group II-VI compound semiconductor. For example, the group IV semiconductor may include silicon, germanium, or silicon-germanium. The second substrate 101 may further include impurities. The second substrate 101 may be provided as a polycrystalline semiconductor layer, such as a polycrystalline silicon layer, or an epitaxial layer.

The first region R1 of the second substrate 101 may be a region in which the gate electrodes 130 are vertically stacked and the channel structures CH are disposed, and may be a region in which memory cells are disposed. The second region R2 of the second substrate 101 is a region in which the gate electrodes 130 extend by different lengths, and may correspond to a region for electrically connecting the memory cells to the first semiconductor structure S1. The second region R2 may be disposed on at least one end of the first region R1 in at least one direction, for example, the X-direction.

The gate electrodes 130 may be vertically spaced apart and stacked on a lower surface of the second substrate 101 to constitute a stack structure GS together with the interlayer insulating layers 120. The stack structure GS may include a first stack structure GS1 and a second stack structure GS2 vertically stacked with the first stack structure GS1 below the first stack structure GS1. However, the number of stages of the stack structure GS is not limited thereto and may vary according to example embodiments, and the stack structure GS may include a single stack structure. The gate electrodes 130 may include first gate electrodes 130a of the first stack structure GS1 and second gate electrodes 130b of the second stack structure GS2.

Referring to FIG. 2B, the gate electrodes 130 may include erase gate electrodes 130E constituting an erase transistor used for an erase operation, at least one lower gate electrode

130L constituting a gate of the ground select transistor, memory gate electrodes 130M constituting a plurality of memory cells, and an upper gate electrode 130U constituting gates of string select transistors. The "lower" and "upper" of the lower gate electrode 130L and the upper gate electrodes 130U may be based on directions during a fabrication process. The number of the memory gate electrodes constituting the memory cells may be determined depending on capacity of the semiconductor device 100. According to example embodiments, the number of the upper and lower gate electrodes 130U and 130L may be 1 to 4 or more, respectively, and the upper and lower gate electrodes 130U and 130L may have a structure the same as or different from a structure of the memory gate electrodes 130M. The erase gate electrodes 130E may be disposed below the upper gate electrode 130U and/or above the lower gate electrode 130L, and may be used for an erase operation using a gate-induced drain leakage (GIDL) phenomenon. In some embodiments, the erase gate electrodes 130E may be omitted.

Among the gate electrodes 130, at least some gate electrodes 130, for example, memory gate electrodes adjacent to the upper or lower gate electrodes 130U and 130L may be dummy gate electrodes 130D. In addition, gate electrodes 130 adjacent to a boundary between the first and second stack structures GS1 and GS2, for example, the first gate electrode 130a disposed in a lowermost portion of the first stack structure GS1 and a second gate electrode 130b disposed in an uppermost portion of the second stack structure GS2 may be dummy gate electrodes 130D as illustrated in FIG. 3A.

The gate electrodes 130 may be vertically spaced apart from each other and stacked on the lower surface of the second substrate 101, and may extend from a first region R1 to a second region R2 by different lengths to form a staircase-like step. The gate electrodes 130 may be disposed to have a step structure in the X-direction and to have a step structure in the Y-direction. In example embodiments, among the gate electrodes 130a and 130b, a desired and/or alternatively predetermined number of (for example, two to five) gate electrodes 130a and 130b may constitute a single gate group, so that a step structure may be formed between the gate groups in the X-direction. A desired and/or alternatively predetermined region including end portions of the gate electrodes 130 may be exposed by the step. The gate electrodes 130 may be connected to the gate contacts 160 in the above regions.

The gate electrodes 130 may be disposed to be at least partially separated in desired and/or alternatively predetermined units by the first and second separation regions MS1, MS2a, and MS2b in the Y-direction. The gate electrodes 130 may constitute a single memory block between a pair of first separation regions MS1 adjacent to each other, but the scope of the memory block is not limited thereto.

The gate electrodes 130 may include a metal material, for example, tungsten (W). In some embodiments, the gate electrodes 130 may include polycrystalline silicon or a metal silicide material.

The interlayer insulating layers 120 may be disposed between the gate electrodes 130. Similar to the gate electrodes 130, the interlayer insulating layers 120 may be spaced apart from each other in a direction perpendicular to a lower surface of the second substrate 101. The interlayer insulating layers 120 may extend in the X-direction. In example embodiments, the interlayer insulating layers 120 may include first interlayer insulating layers 120a of the first stack structure GS1 and second interlayered insulating layers 120b of the second stack structure GS2. The interlayer insulating layers 120a and 120b may include an insulating material such as a silicon oxide or a silicon nitride.

The first stack structure GS1 may include first interlayer insulating layers 120a and first gate electrodes 130a, alternately stacked on the lower surface of the second substrate 101, and may further include a connection insulating layer 125 disposed on a lower surface of a lowermost gate electrode 130a, among the first gate electrodes 130a. The connection insulating layer 125 may include an insulating material, for example, at least one of a silicon oxide, a silicon nitride, and a silicon oxynitride. The connection insulating layer 125 may include the same material as the interlayer insulating layers 120.

The second stack structure GS2 may include second interlayer insulating layers 120b and second gate electrodes 130b alternately stacked on a lower surface of the first stack structure GS1.

The channel structures CH may be disposed on a lower surface of the first region R1 of the second substrate 101. The channel structures CH may each constitute a single memory cell string, and may be disposed to be spaced apart from each other, while forming rows and columns, on the lower surface of the second substrate 101. In an X-Y plane, the channel structures CH may be disposed to form a grid pattern or may be disposed in a zigzag manner in one direction. The channel structures CH may be in the form of a hole, and may have a columnar shape. The channel structures CH may have an inclined side surface having a width decreased in a direction toward the second substrate 101 depending on an aspect ratio.

Each of the channel structures CH may penetrate through the stack structure GS in a Z-direction to be in contact with the second substrate 101. In example embodiment, the channel structures CH may extend inwardly of the second substrate 101 to be in contact with the second substrate 101.

Each of the channel structures CH may include a first channel structure CH1, penetrating through the first stack structure GS1, and a second channel structure CH2 penetrating through the second stack structure GS2. The second channel structure CH2 may penetrate through the second stack structure GS2 to be connected to the first channel structure CH1. For example, the first and second channel structures CH1 and CH2 may have a form in which they are connected to each other. Each of the channel structures CH may have a bent portion formed by a difference or change in widths in the connection region of the first and second channel structures CH1 and CH2. This may be because a width of a lowermost portion of the first channel structure CH1 is greater than a width of an uppermost portion of the second channel structure CH2.

In example embodiments, a portion of the channel structures CH may be a dummy channel. In addition, dummy channels DCH may be further disposed on a lower surface of the second region R2 outside the channel structures CH, as illustrated in FIG. 1.

As illustrated in the enlarged views of FIGS. 3A and 3B, each of the channel structures CH may include a channel layer 140, a channel filling insulating layer 142 filling the channel layer 140, a gate dielectric layer 143 surrounding the channel layer 140, and a channel pad 144.

The channel layer 140 may be formed in an annular shape surrounding the channel filling insulating layer 142 therein. Alternatively, in example embodiments, the channel layer may have a columnar shape such as a columnar shape or a prismatic shape without the channel filling insulating layer 142. The channel layer 140 may be connected to the second substrate 101 in an upper portion thereof. The channel layer 140 may include a semiconductor material such as polycrystalline silicon or single crystal silicon, and the semiconductor material may be an undoped material or a material containing P-type or N-type impurities.

The gate dielectric layer 143 may be disposed between the gate electrodes 130 and the channel layer 140. The gate dielectric layer 143 may include a tunneling layer 143-1, a charge storage layer 143-2, and a blocking layer 143-3 stacked in sequence from the channel layer 140. The tunneling layer 143-1 may tunnel charges into the charge storage layer 143-2 and may include, for example, a silicon oxide ($SiO_2$), a silicon nitride ($Si_3N_4$), a silicon oxynitride (SiON), or combinations thereof. The charge storage layer 143-2 may be a charge trap layer or a floating gate conductive layer. The blocking layer 143-3 may include, for example, a silicon oxide ($SiO_2$), a silicon nitride ($Si_3N_4$), a silicon oxynitride (SiON), a high-k dielectric material, or combinations thereof.

The channel pad 144 may be disposed on only a lower end of the second channel structure CH2 in each of the channel structures CH. In some embodiments, each of the first and second channel structures CH1 and CH2 may include a channel pad 144. In this case, the channel pad 144 of the first channel structure CH1 may be connected to the channel layer 140 of the second channel structure CH2. The channel pad 144 may be disposed to cover a lower surface of the channel filling insulating layer 142 and be electrically connected to the channel layer 140. The channel pad 144 may include, for example, doped polycrystalline silicon.

The channel layer 140, the gate dielectric layer 143, and the channel filling insulating layer 142 may be connected to each other between the first channel structure CH1 and the second channel structure CH2.

As illustrated in the enlarged view of FIG. 3B, each of the channel structures CH may extend inwardly of the second substrate 101 through the stack structure GS. An upper end portion of the channel layer 140 may be in direct contact with the second substrate 101. The upper end portion of the channel layer 140 may refer to a region adjacent to a portion in which the channel structures CH extend inwardly of the second substrate 101. The gate dielectric layer 143 may surround a lower end portion of the channel layer 140.

In example embodiments, the second substrate 101 may include a protrusion 101E extending between the channel layer 140 and an uppermost interlayer insulating layer 120a. The protrusion 101E may cover a portion of a side surface of the uppermost interlayer insulating layer 120a. Accordingly, the lower surface of the second substrate 101 may be disposed on a level on which a region including the protrusion 101E is lower than the other regions. As the protrusion 101E of the second substrate 101 further extends along the channel layer 140 by a desired and/or alternatively predetermined depth, a contact area between the second substrate 101 and the channel layer 140 may be relatively increased. As a result, a semiconductor device having improve electrical characteristics may be provided.

In an example embodiment, each of the channel structures CH may further include a metal-semiconductor compound layer 150 surrounding a portion of the channel filling insulating layer 142. The metal-semiconductor compound layer 150 may have a ring shape surrounding the channel filling insulating layer 142. However, example embodiments are not limited thereto, and metal-semiconductor compound layer 150 may have an intermittent pattern shape surrounding the channel filling insulating layer 142. In addition, when the channel filling insulating layer 142 is omitted, the metal-semiconductor compound layer 150 may have a cylindrical shape. The gate dielectric layer 143 may surround an external side surface of the metal-semiconductor compound layer 150. The metal-semiconductor compound layer 150 may have a length of about 10 nm or less in a vertical direction, for example, the Z-direction.

The metal-semiconductor compound layer 150 may include a metal element and a semiconductor element. The metal element may include, for example, nickel (Ni), cobalt (Co), platinum (Pt), or palladium (Pd). In an example embodiment, the metal-semiconductor compound layer 150 may include nickel silicide, cobalt silicide, platinum silicide, palladium silicide, or combinations thereof.

In an example embodiment, the metal-semiconductor compound layer 150 may include a first metal-semiconductor compound layer 150a and a second metal-semiconductor compound layer 150b. The first and second metal-semiconductor compound layers 150a and 150b may overlap and contact each other in the Z-direction. Each of the first and second metal-semiconductor compound layers 150a and 150b may have a length of about 5 nm or less in the Z-direction. The first and second metal-semiconductor compound layers 150a and 150b may include different metal elements, but example embodiments are not limited thereto. Even when the first and second metal-semiconductor compound layers 150a and 150b include the same metal element, boundaries therebetween may be readily apparent according to process conditions.

In an example embodiment, the metal-semiconductor compound layer 150 may be disposed in the channel layer 140. The metal-semiconductor compound layer 150 may divide the channel layer 140 into at least two regions.

The channel layer 140 may include a first semiconductor material layer 140a on an upper surface of the metal-semiconductor compound layer 150 and a second semiconductor material layer 140b on a lower surface of the metal-semiconductor compound layer 150. External side surfaces of the first and second semiconductor material layers 140a and 140b may be coplanar with the external side surface of the metal-semiconductor compound layer 150. The gate dielectric layer 143 may surround the external side surfaces of the first and second semiconductor material layers 140a and 140b and the metal-semiconductor compound layer 150.

Figure 13:
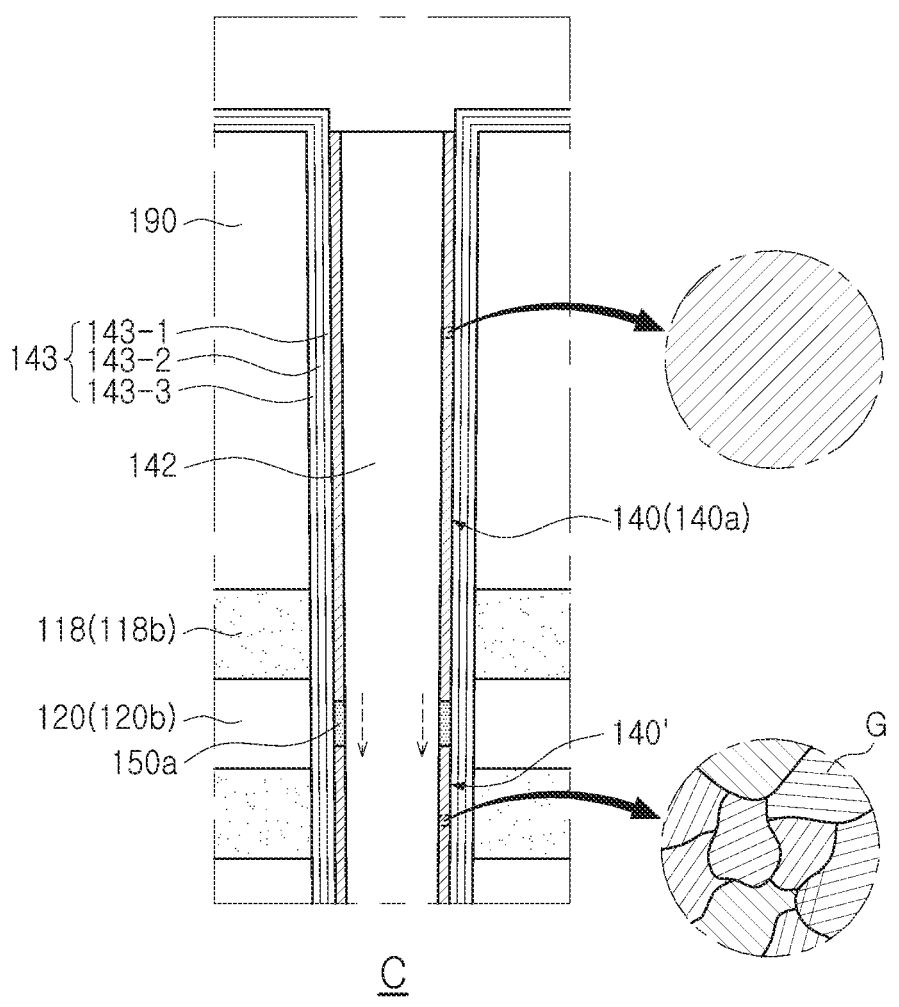

The first semiconductor material layer 140a may be a material layer crystallized by a metal induced lateral crystallization (MILC) method while the first metal-semiconductor compound layer 150a moves along a preliminary channel layer 140' (see FIG. 13). The second semiconductor material layer 140b may be a material layer crystallized by the MILC method while the second metal-semiconductor compound layer 150b moves along the preliminary channel layer 140' (see FIG. 19).

The first and second semiconductor material layers 140a and 140b may have a single crystal structure or a single crystal-like structure. The term "single crystal-like structure" may refer to a polycrystalline structure having a grain size of about 5 μm or more and/or a polycrystalline structure having grains aligned in a desired and/or alternatively predetermined direction, for example, a [001] direction. However, the grain size or crystal direction determining the single crystal-like structure may vary according to example embodiment. In addition, the term "grain size" may refer to an average grain size of a corresponding material layer.

The first and second semiconductor material layers 140a and 140b may be changed from an amorphous/polycrystalline structure, having a grain size of about 0.4 μm or less and/or random crystal orientation, to a single crystal structure or a single crystal-like structure in the MILC process.

Accordingly, the semiconductor device 100 including the channel layer 140 having improved electrical characteristics, such as increased charge mobility or improved resistance characteristics, may be provided.

In an example embodiment, the first semiconductor material layer 140a may include the metal elements of the first metal-semiconductor compound layer 150a diffused from the first metal-semiconductor compound layer 150a, and the second semiconductor material layer 140b may include the metal elements of the second metal-semiconductor compound layer 150b diffused from the second metal-semiconductor compound layer 150b, but example embodiments are not limited thereto.

As the number of gate electrodes 130 constituting the stack structure GS increases, lengths of the channel structures CH penetrating therethrough may also increase. Accordingly, there may be a limitation in achieving crystallization of the channel layer 140 by performing the MILC process from one end of the channel structures CH, for example, a portion in which the channel pad 144 is disposed, to an opposing end of the channel structures CH. However, in the semiconductor device 100 according to example embodiments, the entire channel layer 140 may be crystallized by performing an additional MILC process from the opposite end, for example, an upper end of the channel structures CH. In example embodiments, the second metal-semiconductor compound layer 150b may be a material layer remaining after performing the MILC process from the one end of each of the channel structures CH, and the first metal-semiconductor compound layer 150a may be a material layer remaining after the MILC process is additionally performed from the opposite end of each of the channel structures CH.

The metal-semiconductor compound layer 150 may be electrically connected to the first and second semiconductor material layers 140a and 140b. The metal-semiconductor compound layer 150 may be disposed in a target region adjacent to a boundary between the first channel structure CH1 and the second channel structure CH2. The target region may refer to a channel layer region on a height level of the connection insulating layer 125 and the interlayer insulating layers 120b disposed in an uppermost portion of the second stack structure GS2. According to example embodiments, the target region may refer to a channel layer region on a height level between the lowermost gate electrode 130a of the first stack structure GS1 and the uppermost gate electrode 130b of the second stack structure GS2. The lowermost gate electrode 130a and the uppermost gate electrode 130b may be dummy gate electrodes 130D. When the metal-semiconductor compound layer 150 overlaps the memory gate electrodes 130M in a horizontal direction, for example, the X-direction, because material properties of the first and second semiconductor material layers 140a and 140b are different from those of the first and second semiconductor material layers 140a and 140b, electrical characteristics of the semiconductor device may be affected. Accordingly, the metal-semiconductor compound layer 150 may be adjusted to be disposed within the target region adjacent to the boundary between the first channel structure CH1 and the second channel structure CH2.

In the present specification, each of the channel structures CH has been described as including a gate dielectric layer 143 having a tunneling layer 143-1, a data storage layer 143-2, and a blocking layer 143-3. However, a structure of the channel structures CH may be changed into various structures including a metal-semiconductor compound layer 150 disposed between the first and second semiconductor material layers 140*a* and 140*b* and the first and second semiconductor material layers 140*a* and 140*b*. For example, the channel structures CH may include a single gate dielectric layer surrounding an external side surface of the channel layer 140 and a variable resistance layer surrounding an internal side surface of the channel layer 140. The variable resistance layer may include, for example, a transition metal oxide.

The first and second separation regions MS1, MS2a, and MS2b may be disposed to extend in the X-direction through the gate electrodes 130. The first and second separation regions MS1, MS2a, and MS2b may be disposed to be parallel to each other. The first and second separation regions MS1, MS2a, and MS2b may penetrate through the entire gate electrodes 130, stacked on the second substrate 101, to be connected to the second substrate 101. The first separation regions MS1 extend a single layer in the X-direction, and the second separation regions MS2a and MS2b may intermittently extend between a pair of first separation regions MS1 or may be disposed in only a region. For example, the second separation regions MS2a and MS2b may include second central separation regions MS2a and second auxiliary separation regions MS2b between the first separation region MS1 and the second central separation regions MS2a. The second central separation regions MS2a may be disposed over the first region R1 and the second region R2, and the second auxiliary separation regions MS2b may be disposed on only the second region R2. The second central separation regions MS2a may be disposed to be spaced apart from each other in the X-direction in the second region R2. A shape, in which the second separation regions MS2a and MS2b are spaced apart from each other in the second region R2, may vary according to example embodiments. Also, in example embodiments, the arrangement order, the number, and the like, of the first and second separation regions MS1, MS2a, and MS2b are not limited to those illustrated in FIG. 1.

As illustrated in FIG. 2B, a separation insulating layer 105 may be disposed in the first and second separation regions MS1, MS2a, and MS2b. The separation insulating layer 105 may have a shape in which a width is decreased in a direction toward the second substrate 101 due to a high aspect ratio, but example embodiments are not limited thereto. In example embodiments, a conductive layer may be further disposed in the separation insulating layer 105 in the first and second separation regions MS1, MS2a, and MS2b. In this case, the conductive layer may function as a common source line or a contact plug connected to the common source line of the semiconductor device 100.

The insulating regions SS may extend in the X-direction between the first separation region MS1 and the second central separation region MS2a and between the second central separation regions MS2a in the first region R1, as illustrated in FIG. 1. The insulating regions SS may be disposed to penetrate through a portion of the gate electrodes 130, including a lowermost upper gate electrode 130U, among the gate electrodes 130. As illustrated in FIG. 2B, the insulating regions SS may separate three gate electrodes 130, including the upper gate electrodes 130U, from each other in the Y-direction. However, the number of gate electrodes 130 separated by the insulating regions SS may vary according to example embodiments. The upper gate electrodes 130U separated by the insulating regions SS may constitute different string select lines. A gap-fill insulating layer 103 may be disposed in the insulating regions SS. The gap-fill insulating layer 103 may include an insulating material, for example, a silicon oxide, a silicon nitride, or a silicon oxynitride.

The cell region insulating layer 190 may be disposed to cover the second substrate 101 and the gate electrodes 130 on the lower surface of the second substrate 101. The cell region insulating layer 190 may be formed of an insulating material, and may include at least one of, for example, a silicon oxide, a silicon nitride, and a silicon oxynitride. In example embodiments, the cell region insulating layer 190 may include a plurality of insulating layers.

The passivation layer 199 may be disposed on an upper surface of the second substrate 101. The passivation layer 199 may function as a layer protecting the semiconductor device 100. In an example embodiment, the passivation layer 199 may have openings in some regions thereof to define a pad region connected to an external device. The passivation layer 199 may include at least one of a silicon oxide, a silicon nitride, and a silicon carbide.

The upper interconnection structure may include gate contacts 160, a substrate contact 165, cell contact plugs 170, and cell interconnection lines 180. The upper interconnection structure may be configured to electrically connect the second semiconductor structure S2 to the first semiconductor structure S1.

The gate contacts 160 may penetrate through the cell region insulating layer 190 to be connected to the gate electrodes 130. The substrate contact 165 may be connected to the second substrate 101.

The cell contact plugs 170 may include first to third cell contact plugs 172, 174, and 176, and the cell interconnection lines 180 may include the first and second cell interconnection lines 182 and 184. The channel pad 144, the gate contacts 160, and the substrate contact 165 may be connected to the first cell contact plugs 172 in a lower end thereof. The first cell contact plugs 172 may be connected to the second cell contact plugs 174 on a lower end thereof, and the second cell contact plugs 174 may be connected to the first cell interconnection lines 182 on lower ends thereof. The third cell contact plugs 176 may vertically connect the first and second cell interconnection lines 182 and 184 to each other. The cell contact plugs 170 may have a cylindrical shape. The cell contact plugs 170 may have different lengths. For example, the first cell contact plugs 172 may have a relatively great length. In example embodiments, the cell contact plugs 170 may have inclined side surfaces of which widths are narrowed in a direction toward the second substrate 101 and are increased in a direction toward the first semiconductor structure S1 depending on an aspect ratio. In example embodiments, some of the cell contact plugs 170 may be dummy contact plugs to which an electrical signal is not applied.

The first cell interconnection lines 182 may include bitlines of the first region R1, connected to the channel structures CH, and interconnection lines of the second region R2 disposed on the same height as the bitlines. The second cell interconnection lines 184 may be interconnection lines disposed below the first cell interconnection lines 182. The cell interconnection lines 180 may have a line shape extending in at least one direction. In example embodiments, the second cell interconnection lines 184 may have a thickness, greater than a thickness of the first cell interconnection lines 182. The cell interconnection lines 180 may have inclined side surfaces of which widths are narrowed in a direction toward the second substrate 101.

The gate contacts 160, the substrate contact 165, the cell contact plugs 170, and the cell interconnection lines 180 may include, for example, tungsten (W), aluminum (Al), copper (Cu), tungsten nitride (WN), tantalum nitride (TaN), titanium nitride (TiN), or combinations thereof.

The second semiconductor structure S2 may further include through-vias penetrating through the second substrate 101 to be connected to the lower second interconnection structure in a region, not illustrated.

The second bonding vias 195 of the second bonding structure may be disposed below the second cell interconnection lines 184 to be connected to the second cell interconnection lines 184, and the second bonding metal layers 198 of the second bonding structure may be connected to the second bonding vias 195. A lower surface of the second bonding metal layers 198 may be exposed to a lower surface of the second semiconductor structure S2. The second bonding metal layers 198 may be bonded and connected to the first bonding metal layers 298 of the first semiconductor structure S 1. The second bonding vias 195 and the second bonding metal layers 198 may include a conductive material, for example, copper (Cu).

In example embodiments, the cell region insulating layer 190 may include a bonding insulating layer having a desired and/or alternatively predetermined thickness from a lower surface thereof. In this case, the bonding insulating layer may form dielectric-to-dielectric bonding to the bonding insulating layer of the first semiconductor structure S1. The bonding insulating layer may include at least one of, for example, SiO, SiN, SiCN, SiOC, SiON, and SiOCN.

The first and second semiconductor structures S1 and S2 may be bonded by bonding of the first bonding metal layers 298 and the second bonding metal layers 198 and bonding of the bonding insulating layers. The bonding of the first bonding metal layers 298 and the second bonding metal layers 198 may be, for example, copper-to-copper (Cu-to-Cu) bonding, and the bonding of the bonding insulating layers may be, for example, dielectric-to-dielectric bonding such as SiCN-to-SiCN bonding. The first and second semiconductor structures S1 and S2 may be bonded by hybrid bonding including copper-to-copper (Cu-to-Cu) bonding and dielectric-to-dielectric bonding.

Figure 4:
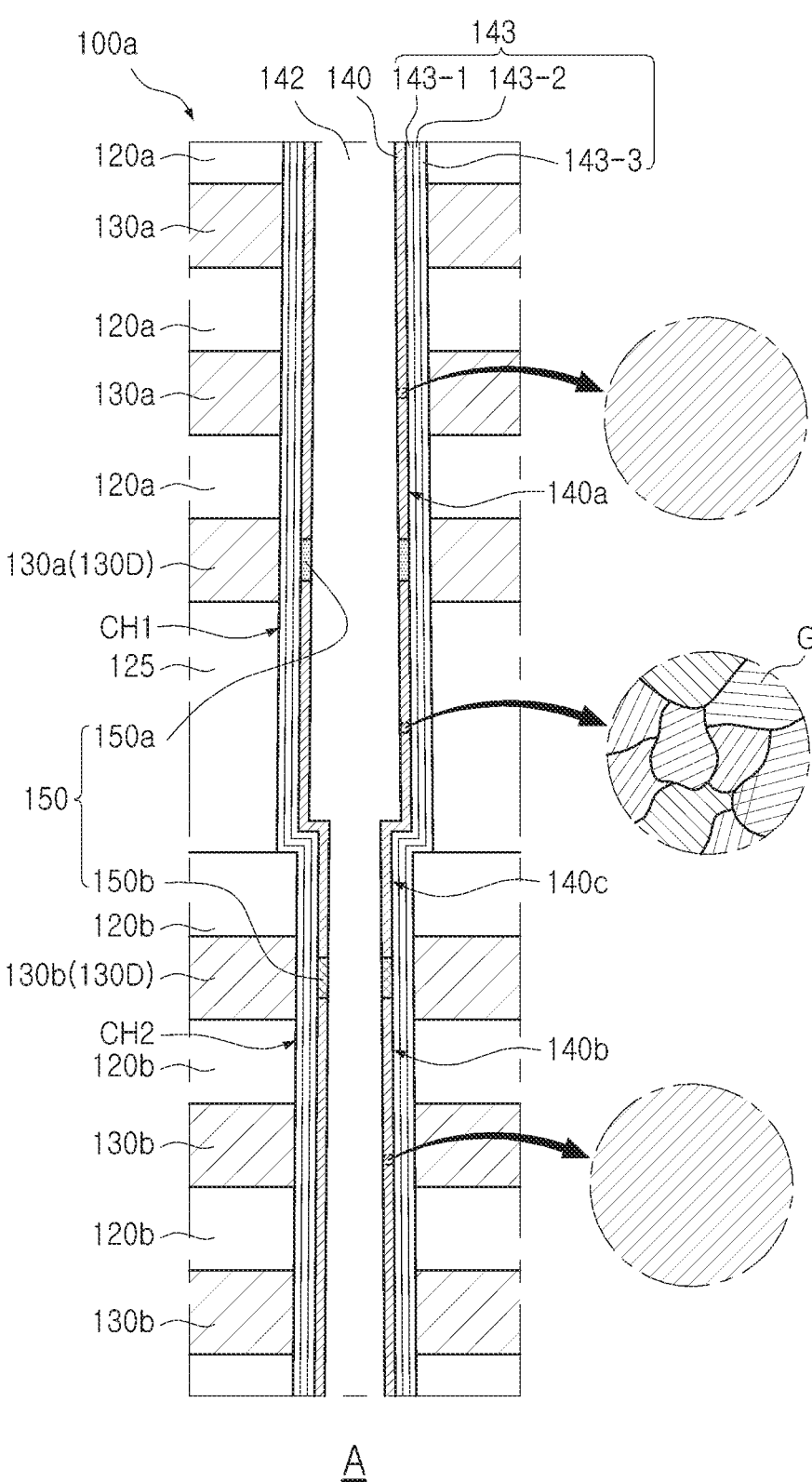
FIG. 4 is a partially enlarged view of a semiconductor device according to example embodiments.

FIG. 4 is a partially enlarged view of a semiconductor device 100a according to example embodiments. FIG. 4 illustrates a region corresponding to region "A" of FIG. 2A.

Referring to FIG. 4, in the semiconductor device 100a, first and second metal-semiconductor compound layers 150a and 150b may be disposed to be spaced apart from each other. The channel layer 140 may include a first semiconductor material layer 140a extending from an upper surface of the first metal-semiconductor compound layer 150a, a second semiconductor material layer 140b extending from a lower surface of the second metal-semiconductor compound layer 150b, and a third semiconductor material layer 140c disposed between the first and second metal-semiconductor compound layers 150a and 150b.

The first and second semiconductor material layers 140a and 140b may have grain sizes or crystal orientations from those of the third semiconductor material layer 140c. The first and second semiconductor material layers 140a and 140b may have higher crystallinity than the third semiconductor material layer 140c. The grain sizes of the first and second semiconductor material layers 140a and 140b may be larger than the grain sizes of the third semiconductor material layer 140c. The first and second semiconductor material layers 140a and 140b may have a grain size of about 5 μm or more, or may include grains having orientation in a desired and/or alternatively predetermined direction, for example, a [001] direction. The third semiconductor material layer 140c may have a grain size of about 0.4 μm or less or may include grains having random crystal orientation. The first and second semiconductor material layers 140a and 140b may be material layers transformed into a single crystal structure or a single crystal-like structure in an MILC process, and the third semiconductor material layer 140c may be a material layer transformed into a polycrystalline structure through thermal change or remaining as an amorphous structure.

The third semiconductor material layer 140c may be a layer remaining because the first and second metal-semiconductor compound layers 150a and 150c do not crystallize the entire channel layer 140 depending on process conditions, or the like, in the MILC process performed twice. Even in this case, as an average grain size of the channel layer 140 is increased by the first and second semiconductor material layers 140a and 140b, a semiconductor device having improved electrical characteristics may be provided.

Each of the first and second metal-semiconductor compound layers 150a and 150b may be adjusted to be disposed in a target region adjacent to the boundary between the first channel structure CH1 and the second channel structure CH2 even when the first and second metal-semiconductor compound layers 150a and 150b are spaced apart from each other. The target region may refer to a channel layer region on a height level between a lowermost gate electrode 130a of the first stack structure GS1 and an uppermost gate electrode 130b of the second stack structure GS2. The lowermost gate electrode 130a and the uppermost gate electrode 130b may be dummy gate electrodes 130D.

Figure 5:
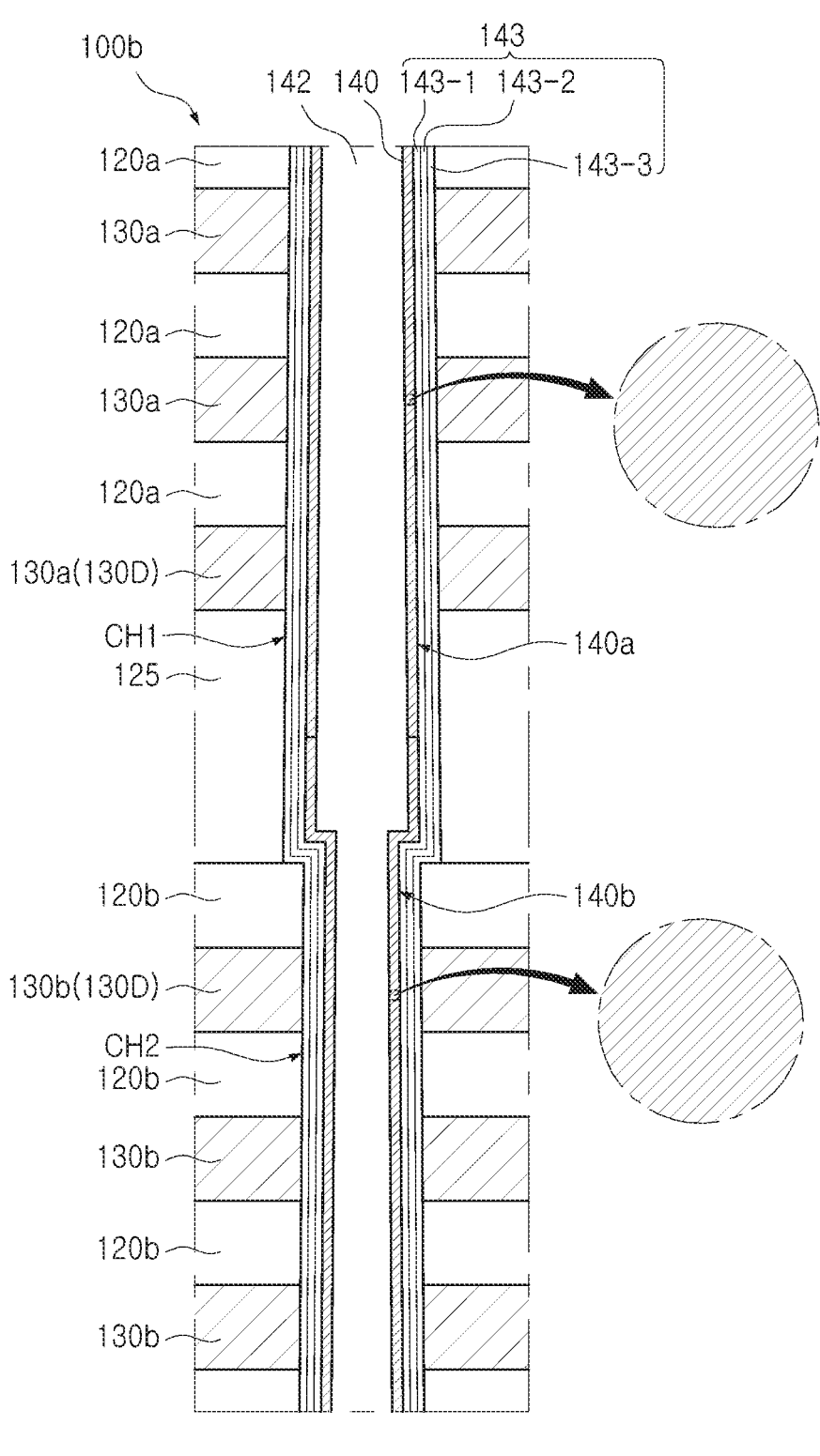
FIG. 5 is a partially enlarged view of a semiconductor device according to example embodiments.

FIG. 5 is a partially enlarged view of a semiconductor device 100b according to example embodiments. FIG. 5 illustrates a region corresponding to region "A" of FIG. 2A.

Referring to FIG. 5, in the semiconductor device 100b, first and second metal-semiconductor compound layers 150a and 150b may be omitted, unlike the semiconductor device 100 of FIG. 3A. In the present embodiment, the first and second metal-semiconductor compound layers 150a and 150b may be consumed while performing an MILC process and may not finally remain. For example, when the first and second metal-semiconductor compound layers 150a and 150b are formed to have a relatively small thickness as compared with the semiconductor device 100 of FIG. 3A, the semiconductor device 100b according to the present embodiment may be provided.

A channel layer 140 may include first and second semiconductor material layers 140a and 140b, and the first and second semiconductor material layers 140a and 140b may have a single crystal structure or a single crystal-like structure, as described in FIG. 2A.

The first and second semiconductor material layers 140a and 140b may be in contact with each other. As described in 2A, the first semiconductor material layer 140a may be a material layer crystallized by an MILC method while the first metal-semiconductor compound layer 150a moves along s preliminary channel layer 140' (see FIG. 13), and the second semiconductor material layer 140b may be a material layer crystallized by the MILC method while the second metal-semiconductor compound layer 150b moves along the preliminary channel layer 140'. The first semiconductor material layer 140a may include metal elements of the first metal-semiconductor compound layer 150a, and the second semiconductor material layer 140b may include metal elements of the second metal-semiconductor compound layer 150b. However, even when the first and second metal-semiconductor compound layers 150a and 150b include the same type of metal element, an interface between the first and second semiconductor material layers 140a and 140b may be apparent because a metal concentration in the vicinity of the interface is higher than metal concentrations in the other regions. In some embodiments, when the type of metal element, the metal concentration, and the crystal direction of the first and second semiconductor material layers 140a and 140b are the same, the interface between the first and second semiconductor material layers 140a and 140b may not be apparent.

In an example embodiment, the interface between the first and second semiconductor material layers 140a and 140b may be adjusted to be disposed in a target region adjacent to a boundary between a first channel structure CH1 and a second channel structure CH2. In some embodiments, the interface between the first and second semiconductor material layers 140a and 140b may be disposed in a region, other than the target region. This is because, when the first and second metal-semiconductor compound layers 150a and 150b are adjusted to not remain, unlike the semiconductor device 100 of FIG. 2A, electrical characteristics of the semiconductor device may be relatively little affected depending on whether the first and second metal-semiconductor compound layers 150a and 150b overlap gate electrodes 130.

Figure 6:
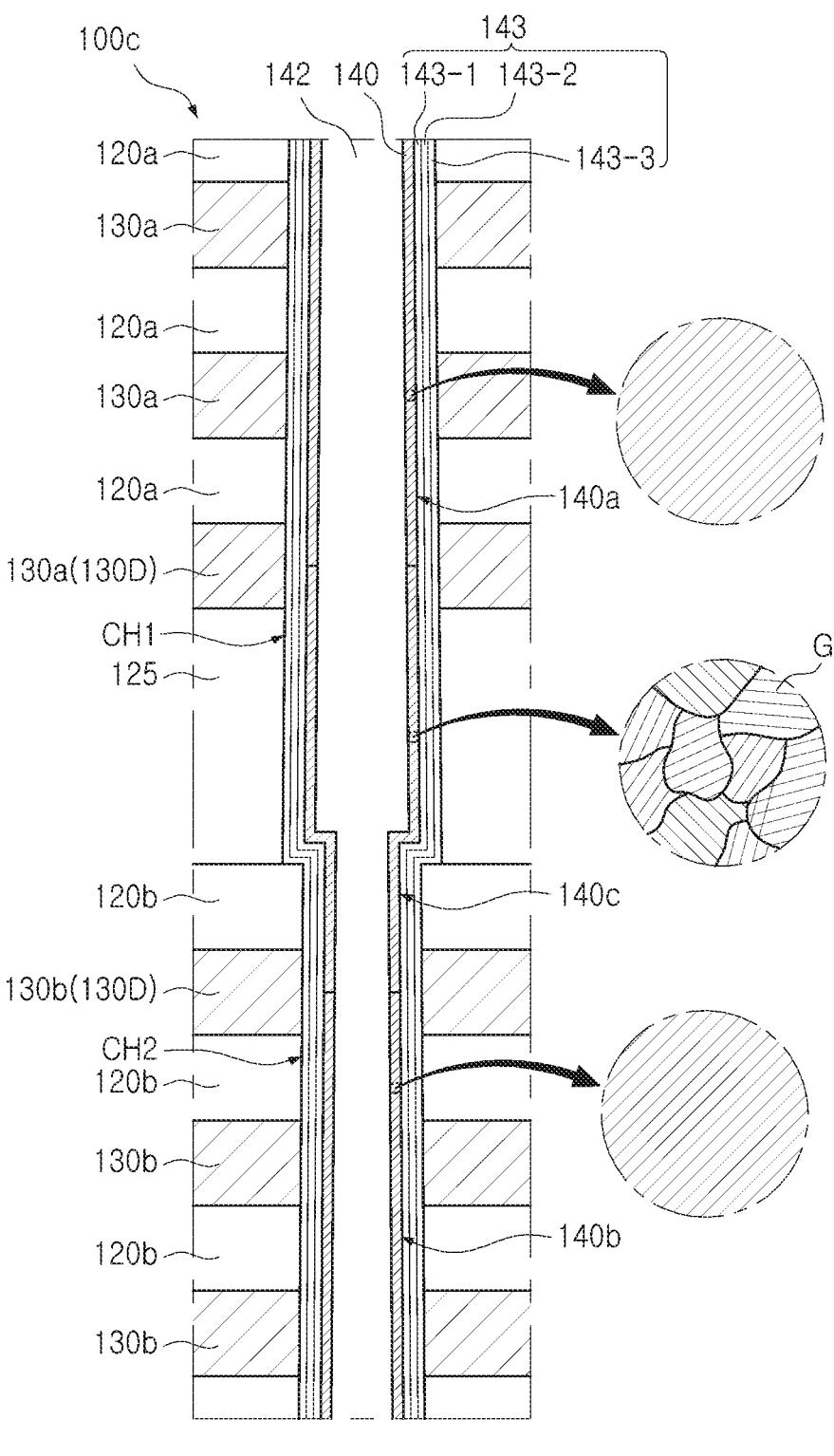
FIG. 6 is a partially enlarged view of a semiconductor device according to example embodiments.

FIG. 6 is a partially enlarged view of a semiconductor device 100c according to example embodiments. FIG. 6 illustrates a region corresponding to region "A" of FIG. 2A.

Referring to FIG. 6, in the semiconductor device 100c, first and second metal-semiconductor compound layers 150a and 150b may be omitted, unlike the semiconductor device 100a of FIG. 4. In the present embodiment, the first and second metal-semiconductor compound layers 150a and 150b may be consumed while performing an MILC process and may not finally remain.

A channel layer 140 may include first to third semiconductor material layers 140a, 140b, and 140c. The third semiconductor material layer 140c may be disposed between the first and second semiconductor material layers 140a and 140b.

As described in FIG. 5, the first semiconductor material layer 140a may include metal elements of the first metal-semiconductor compound layer 150a, and the second semiconductor material layer 140b may include metal elements of the second metal-semiconductor compound layer 150b.

The first semiconductor material layer 140a may have a relatively high metal concentration at an interface in contact with the third semiconductor material layer 140c. The second semiconductor material layer 140b may have a relatively high metal concentration at an interface in contact with the third semiconductor material layer 140c.

The first and second semiconductor material layers 140a and 140b may have different grain sizes or crystal orientations from those of the third semiconductor material layer 140c. The first and second semiconductor material layers 140a and 140b may have higher crystallinity than the third semiconductor material layer 140c. The grain sizes of the first and second semiconductor material layers 140a and 140b may be larger than the grain sizes of the third semiconductor material layer 140c. The first and second semiconductor material layers 140a and 140b may have a grain size of about 5 μm or more, or may have grains having orientation in a desired and/or alternatively predetermined direction, for example, a [001] direction. The third semiconductor material layer 140c may have a grain size of about 0.4 μm or less, or may include grains having random crystal orientation. The first and second semiconductor material layers 140a and 140b may be material layers transformed into a single crystal structure or a single crystal-like structure in an MILC process, and the third semiconductor material layer 140c may be a material layer transformed into a polycrystalline structure through thermal change or remaining as an amorphous structure.

The third semiconductor material layer 140c may be in contact with the first and second semiconductor material layers 140a and 140b on a level adjacent to a boundary between the first and second channel structures CH1 and CH2, but example embodiments are not limited thereto.

Figure 7:
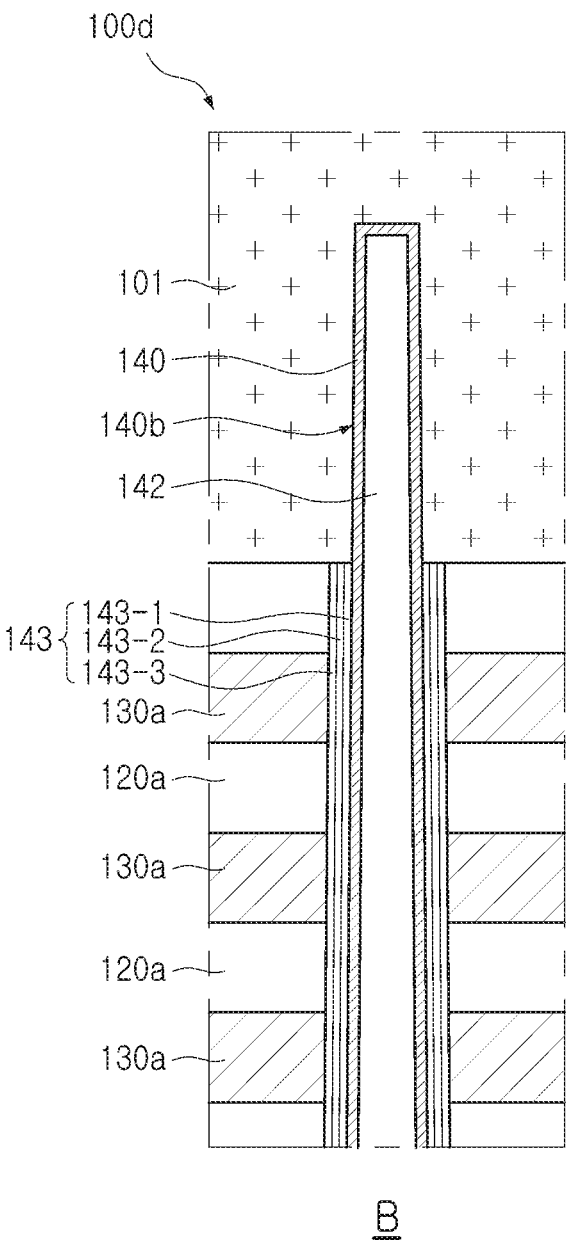
FIG. 7 is a partially enlarged view of a semiconductor device according to example embodiments.

FIG. 7 is a schematic cross-sectional view of a semiconductor device 100d according to example embodiments. FIG. 7 illustrates a region corresponding to region "B" of FIG. 2A.

Referring to FIG. 7, in the semiconductor device 100d, a lower surface of the second substrate 101 may be disposed on substantially the same level as a region, adjacent to the channel layer 140, in the other regions. For example, the second substrate 101 may not include a protrusion 101E, unlike the semiconductor device 100 of FIG. 3B.

The gate dielectric layer 143 may not be recessed and may be coplanar with an upper surface of an uppermost interlayer insulating layer 120a, unlike FIG. 3B

Figure 8:
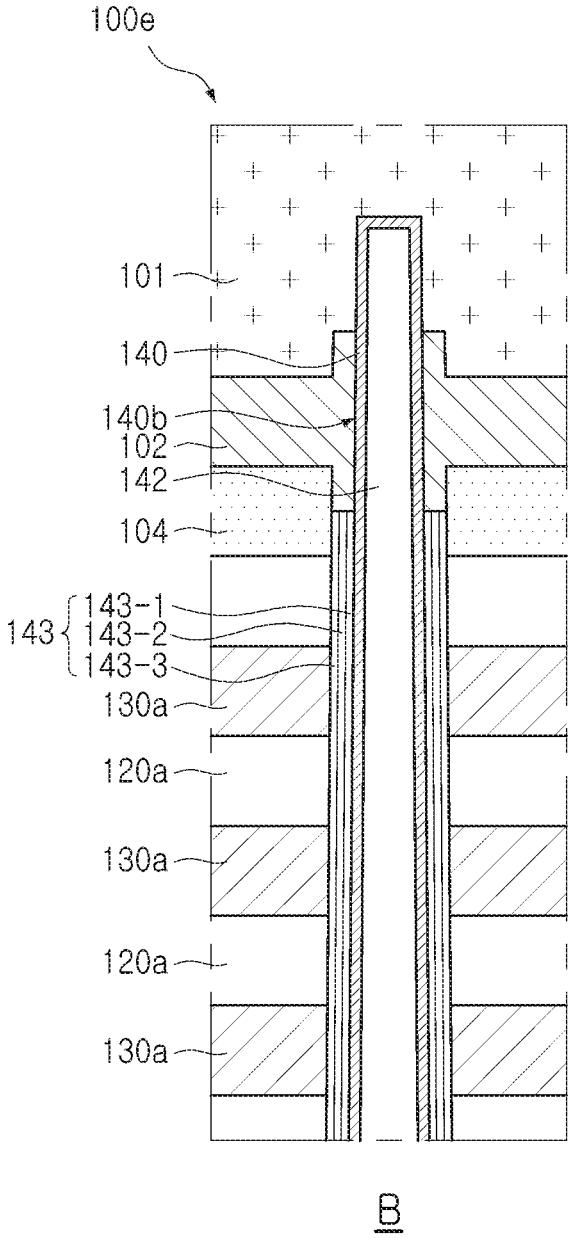
FIG. 8 is a partially enlarged view of a semiconductor device according to example embodiments.

FIG. 8 is a schematic cross-sectional view of a semiconductor device 100e according to example embodiments. FIG. 8 illustrates a region corresponding to region "B" of FIG. 2A.

Referring to FIG. 8, the semiconductor device 100e may further include first and second horizontal conductive layers 102 and 104 disposed between a second substrate 101 and gate electrodes 130a and 130b.

The first and second horizontal conductive layers 102 and 104 may be sequentially stacked and disposed on a lower surface of a first region R1 (see FIG. 2A) of a second substrate 101. The first horizontal conductive layer 102 may not extend to a second region R2 of the second substrate 101, and the second horizontal conductive layer 104 may extend to the second region R2.

The first horizontal conductive layer 102 may function as a portion of a common source line of the semiconductor device 100e, and may function as, for example, a common source line together with the second substrate 101. The first horizontal conductive layer 102 may be directly connected to the channel layer 140 on a periphery of the channel layer 140.

The second horizontal conductive layer 104 may be in contact with the second substrate 101 in regions in which the first horizontal conductive layer 102 is not disposed. The second horizontal conductive layer 104 may be bent while covering an end portion of the first horizontal conductive layer 102 in the regions to extend upwardly of the second substrate 101.

The first and second horizontal conductive layers 102 and 104 may include a semiconductor material. Both the first and second horizontal conductive layers 102 and 104 may include, for example, polycrystalline silicon. In this case, at least the first horizontal conductive layer 102 may be a doped layer, and the second horizontal conductive layer 104 may be a doped layer or a layer containing impurities diffused from the first horizontal conductive layer 102. However, in example embodiments, the second horizontal conductive layer 104 may be replaced with an insulating layer.

The semiconductor device 100e may further include a horizontal insulating layer disposed on a lower surface of the second substrate 101 to be side by side with the first horizontal conductive layer 102 in at least a portion of the second region R2 (see FIG. 2A). The horizontal insulating layer may include first to third horizontal insulating layers alternately stacked on the lower surface of the second substrate 101. The horizontal insulating layer may be layers remaining after a portion of the horizontal insulating layer is replaced with the first horizontal conductive layer 102 in a process of fabricating the semiconductor device. The horizontal insulating layer may include a silicon oxide, a silicon nitride, a silicon carbide, or a silicon oxynitride.

In an example embodiment, a gate dielectric layer 143 may be disposed to surround a side surface of the channel layer 140 below the first horizontal conductive layer 102 as illustrated in FIG. 8, but is not limited thereto. In this case, the gate dielectric layer 143 may be disposed on the first horizontal conductive layer 102 to cover a side surface and an upper surface of the channel layer 140 together.

FIGS. 9 to 19 are schematic cross-sectional views illustrating a method of fabricating a semiconductor device according to example embodiments.

Figure 14:
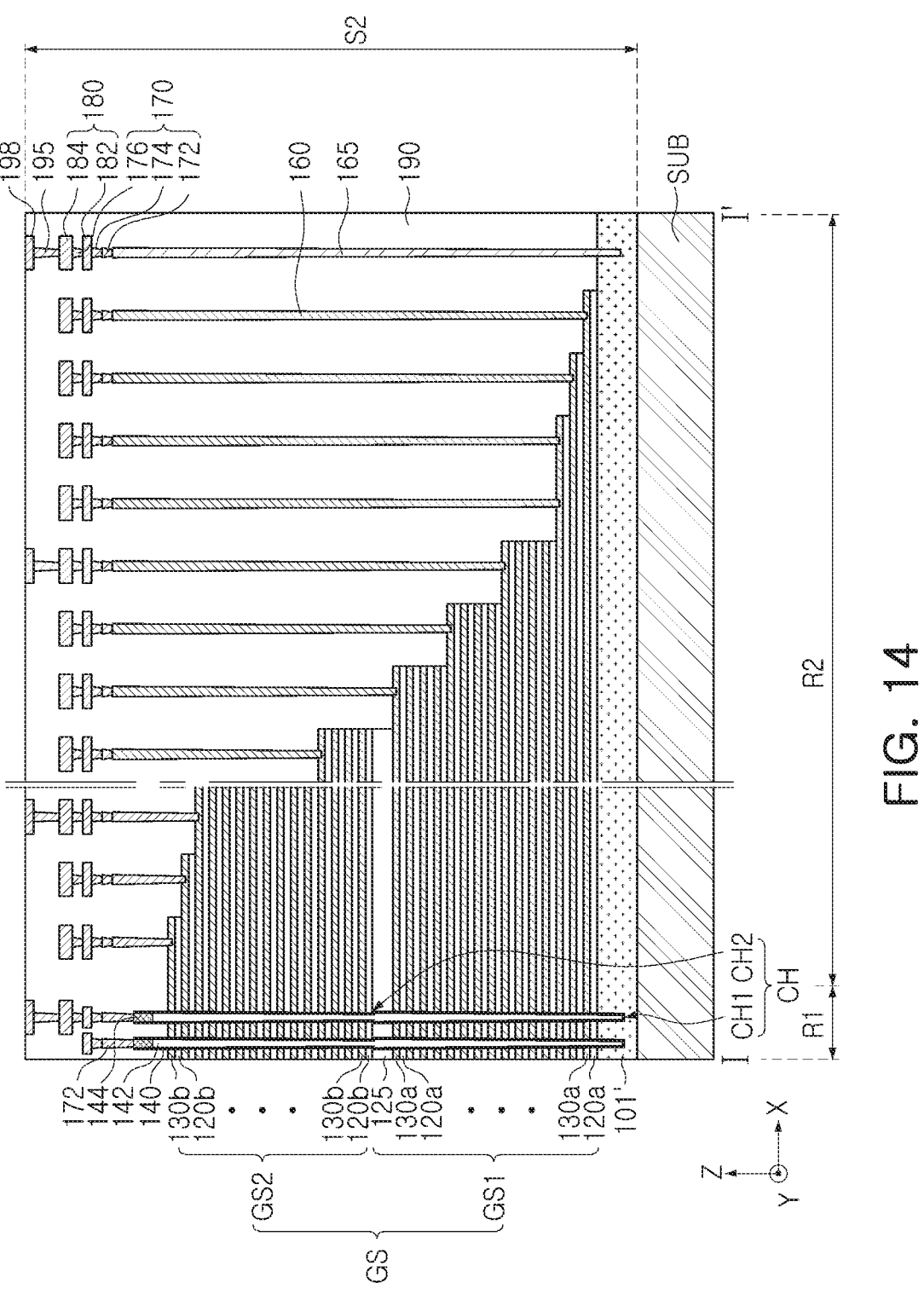
Figure 15:
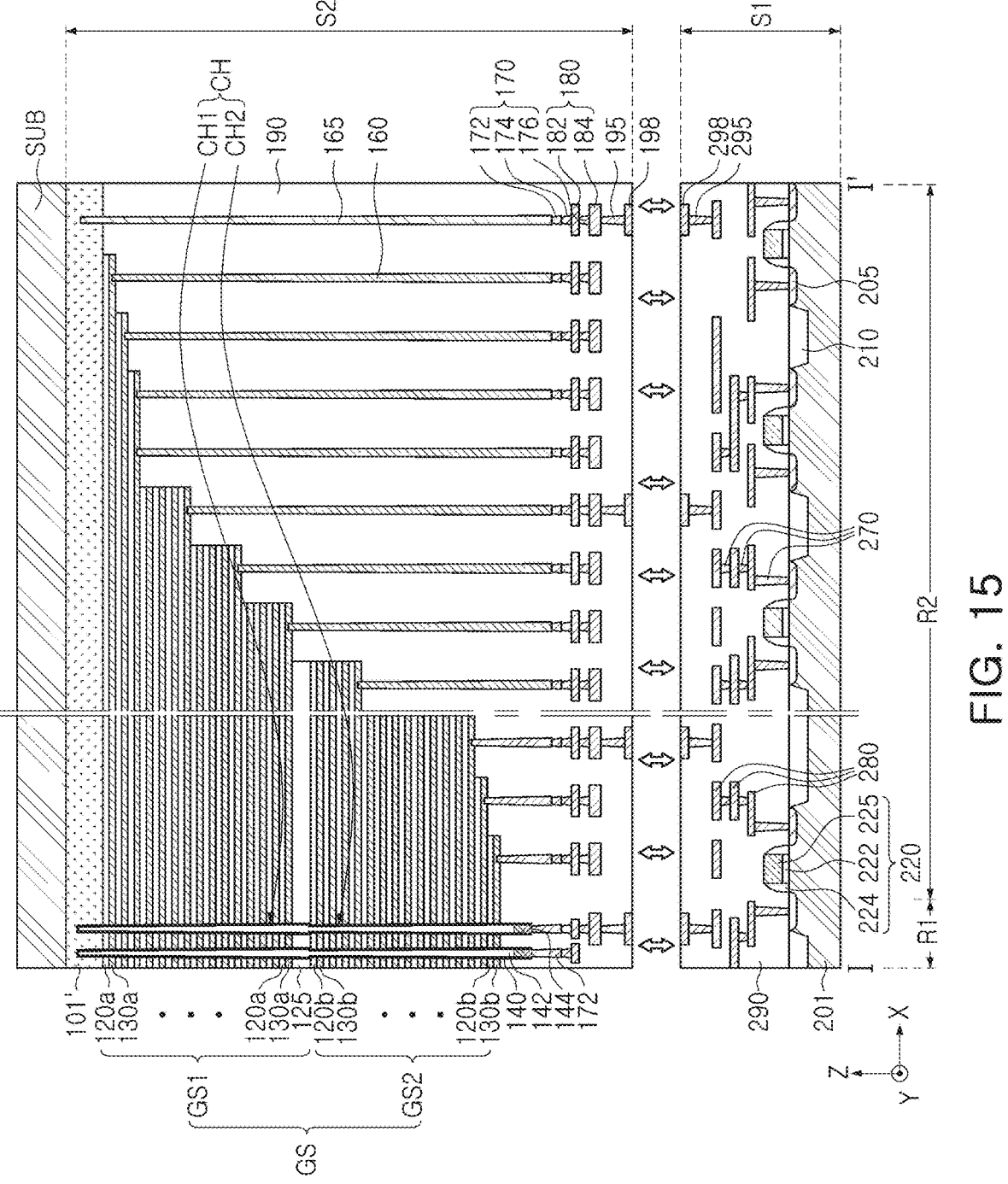
Figure 16:
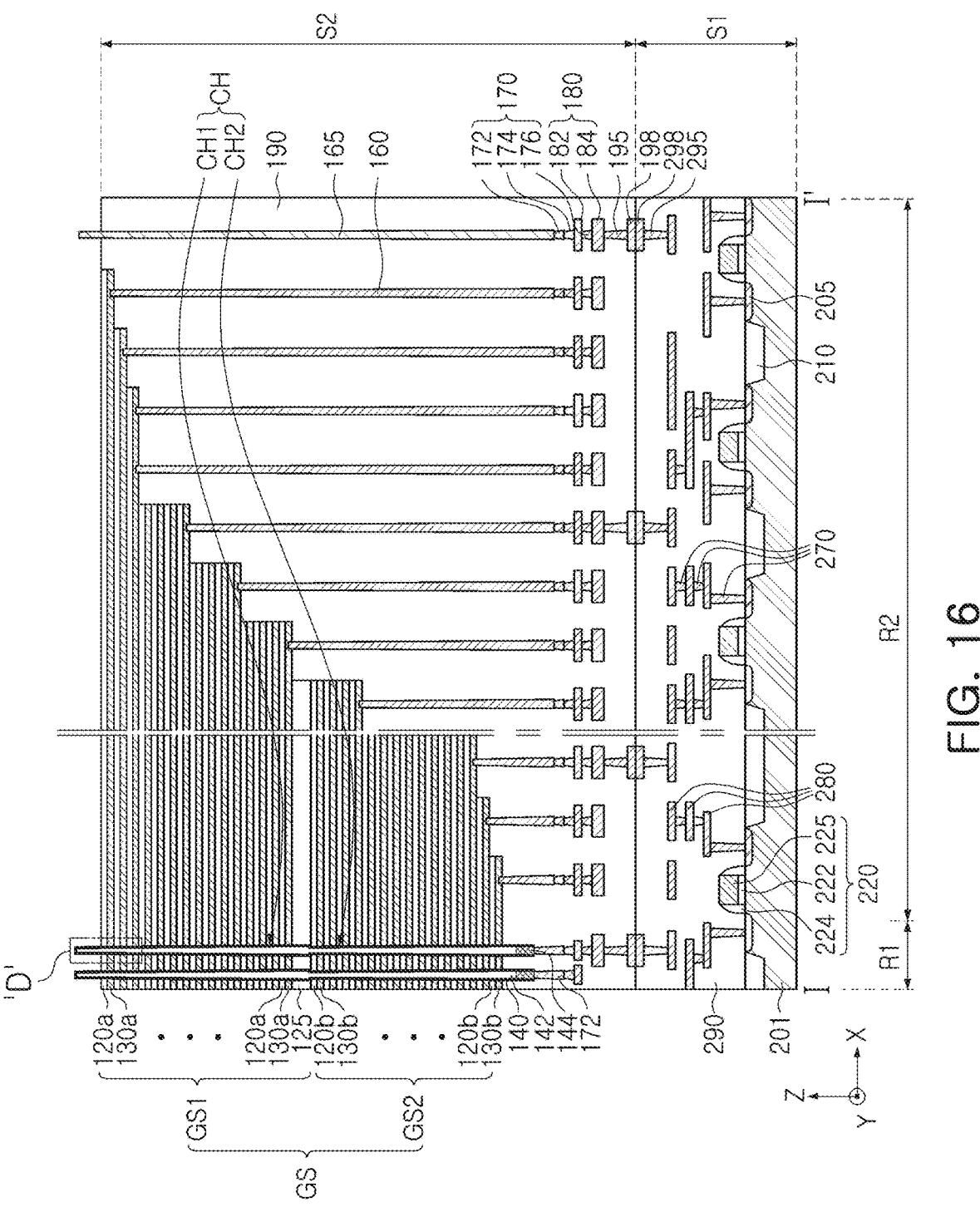

FIGS. 9, 10A, 14, 15, and 16 illustrate cross-sections corresponding to FIG. 2A, FIGS. 10B to 13 are partially enlarged views corresponding to region "C" of FIG. 10A, and FIGS. 17 to 19 are partially enlarged view corresponding to region "D" of FIG. 16.

Figure 9:
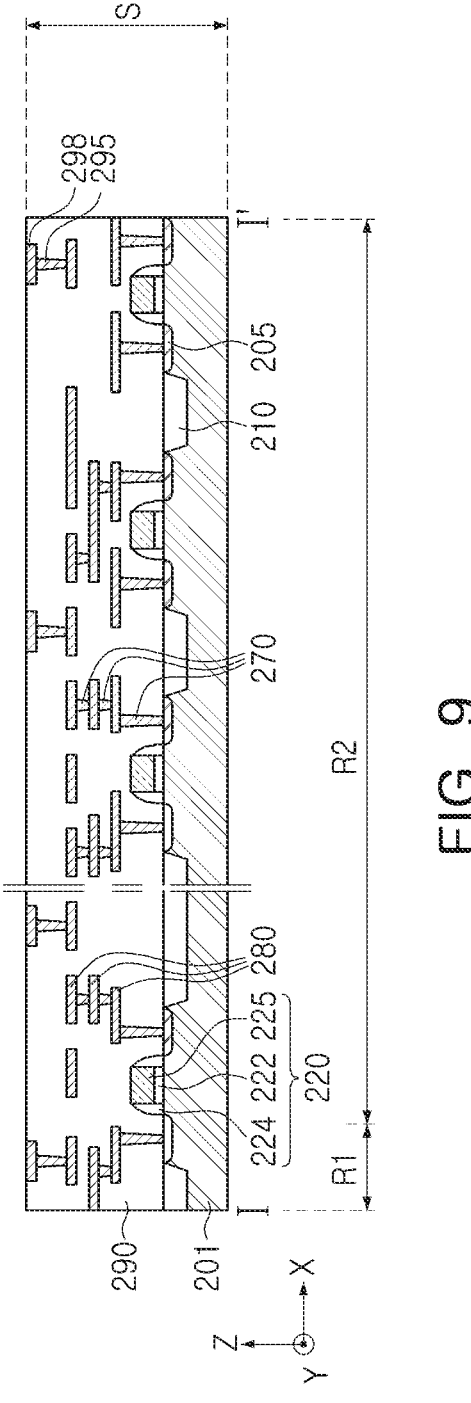
FIGS. 9 to 19 are schematic cross-sectional views illustrating a method of fabricating a semiconductor device according to example embodiments.

Referring to FIG. 9, a first semiconductor structure 51 including circuit devices 220, lower interconnection structures, and a lower bonding structure may be formed on the first substrate 201.

Device isolation layers 210 may be formed in a first substrate 201, and a circuit gate dielectric layer 222 and a circuit gate electrode 225 may then be sequentially formed on the first substrate 201. The device isolation layers 210 may be formed by, for example, a shallow trench isolation (STI) process. A circuit gate dielectric layer 222 and a circuit gate electrode 225 may be formed using atomic layer deposition (ALD) or chemical vapor deposition (CVD). The circuit gate dielectric layer 222 may be formed of a silicon oxide, and the circuit gate electrode 225 may be formed of at least one of polycrystalline silicon or a metal silicide, but example embodiments are not limited thereto. A spacer layer 224 and source/drain regions 205 may be formed on opposite sidewalls of the circuit gate dielectric layer 222 and the circuit gate electrode 225. In example embodiments, the spacer layer 224 may include a plurality of layers. Then, an ion implantation process may be performed to form the source/drain regions 205.

Circuit contact plugs 270 of the lower interconnection structure and first bonding vias 295 of the lower bonding structure may be formed by forming a portion of a peripheral region insulating layer 290, etching the portion of the peripheral region insulating layer 290 to be removed, and filling the removed portion with a conductive material. A circuit interconnection lines 280 of the lower interconnection structure and a first bonding metal layers 298 of the lower bonding structure may be formed by, for example, depositing a conductive material and patterning the conductive material having been deposited. The first bonding metal layers 298 may be formed such that upper surfaces thereof are exposed through the peripheral region insulating layer 290.

The peripheral region insulating layer 290 may include a plurality of insulating layers. A portion of the peripheral region insulating layer 290 may be formed in each operation of forming the first interconnection structure and the first bonding structure. The first semiconductor structure S1 may be formed in the present operation.

Figure 10A:
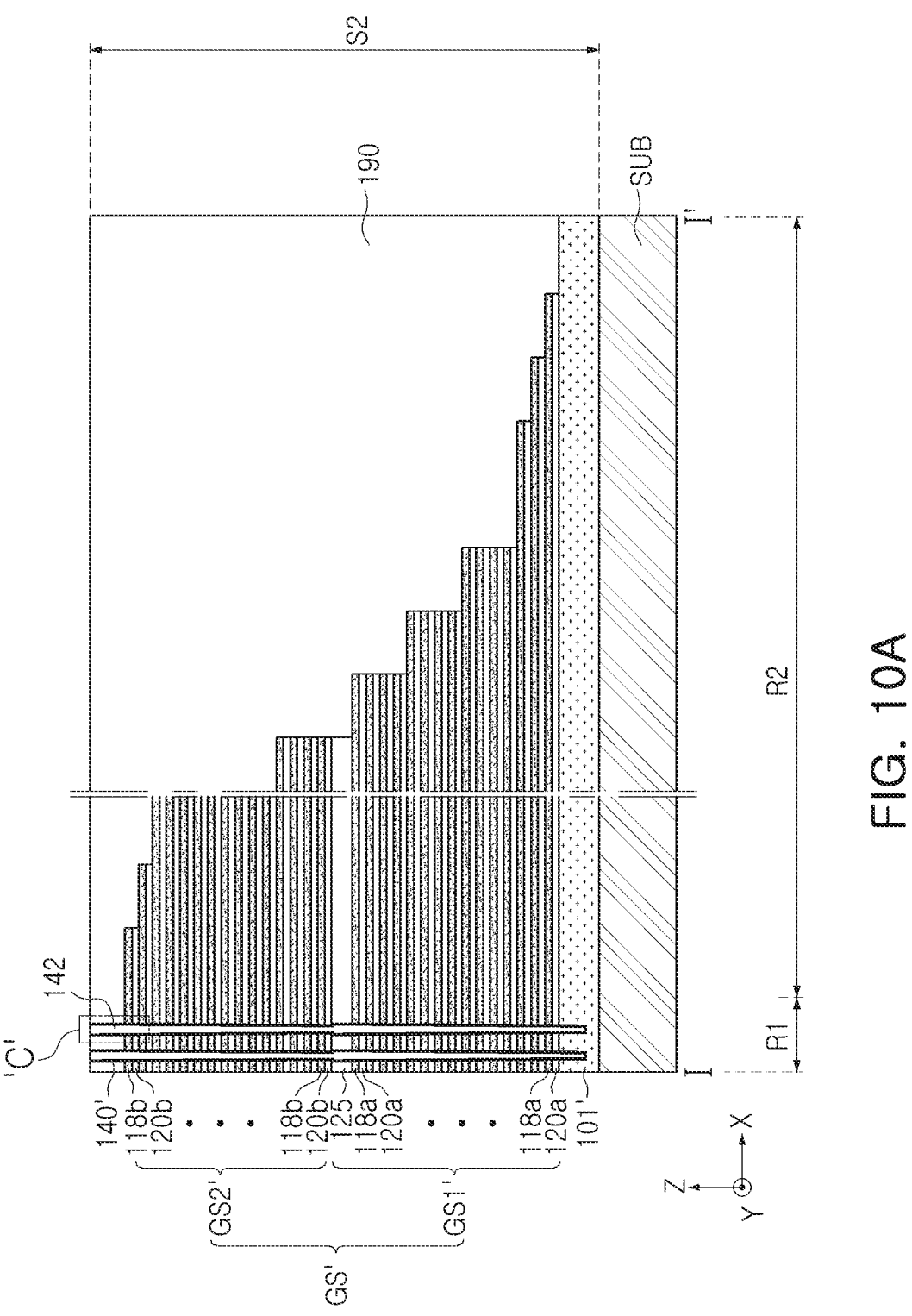
Figure 10B:
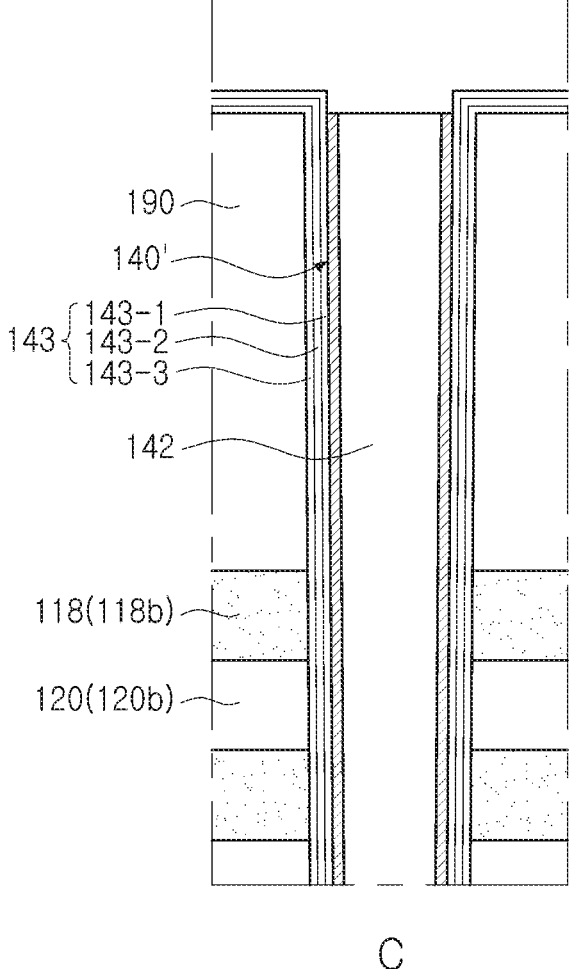

Referring to FIGS. 10A and 10B, a process of fabricating a second semiconductor structure S2 may be started. A second preliminary substrate 101' may be formed on a base substrate SUB, a preliminary stack structure GS' may be formed, and a gate dielectric layer 143, a preliminary channel layer 140', and a channel filling insulating layer 142 may then be formed in a channel hole penetrating through the preliminary stack structure GS'.

The base substrate SUB may be a layer removed in a subsequent process, and may be a semiconductor substrate such as silicon (S1). The second preliminary substrate 101' may be a layer removed through a subsequent process, and may be formed of, for example, a polycrystalline silicon layer or an epitaxial layer. In an example embodiment, the second preliminary substrate 101' may be formed of a polycrystalline silicon layer which does not include impurities. In some embodiments, a subsequent process may be performed using a single substrate, for example, by omitting the base substrate SUB or the second preliminary substrate 101'.

Interlayer insulating layers 120 and sacrificial insulating layers 118 may be alternately deposited to form a preliminary stack structure GS'. The preliminary stack structure GS' may include a first preliminary stack structure GS1', including first interlayer insulating layers 120a and first sacrificial insulating layers 118a, and a second preliminary stack structure GS2' including second sacrificial insulating layers 120b and second sacrificial insulating layers 118b. The sacrificial insulating layers 118 may be replaced with gate electrodes 130 in a subsequent process. The sacrificial insulating layers 118 may be formed of a material which may be etched with etching selectivity with respect to the interlayer insulating layers 120 under specific etching conditions. For example, the interlayer insulating layers 120 may be formed of at least one of a silicon oxide and a silicon nitride, and the sacrificial insulating layers 118 may be formed of a material, different from a material of the interlayer insulating layers 120 selected from the group consisting of silicon, a silicon oxide, a silicon carbide, and a silicon nitride. In example embodiments, thicknesses of the interlayer insulating layers 120 may not all be the same. In an example embodiment, the first preliminary stack structure GS 1' may further include a connection insulating layer 125 having a thickness, greater than a thickness of the interlayer insulating layers 120 or the sacrificial insulating layers 118. The connection insulating layer 125 may include an insulating material, for example, the same material as the interlayer insulating layers 120.

A cell region insulating layer 190 may be formed to cover the preliminary stack structure GS', and a portion of the second preliminary stack structure GS2' may be removed to form an insulating region SS (see FIG. 2B). To form the insulating region SS, a region in which the insulating region SS is to be formed may be exposed using an additional mask layer, and a desired and/or alternatively predetermined number of sacrificial insulating layers 118 and interlayer insulating layers 120 may be removed form an uppermost portion and an insulating material may then be deposited to form a gap-fill insulating layer 103 (see FIG. 2B).

An anisotropic etching process may be performed to form a channel hole penetrating through the preliminary stack structure GS' and exposing the second preliminary substrate 101', and a gate dielectric layer 143 and a preliminary channel layer 140', and a channel filling insulating layer 142 may be sequentially deposited. In an example embodiment, the channel hole may be formed by forming a channel sacrificial layer in a first channel hole penetrating through a first preliminary stack structure GS' and removing the channel sacrificial layer through a second channel hole penetrating through a second preliminary stack structure GS2', but a method of forming the channel hole is not limited thereto. The gate dielectric layer 143 may be formed by sequentially depositing a tunneling layer 143-1, a data storage layer 143-2, and a blocking layer 143-3 in the channel hole. For example, the deposition process may include an atomic layer deposition (ALD) process or a chemical vapor deposition (CVD) process. Then, a preliminary channel layer 140', conformally covering the gate dielectric layer 143, and a channel filling insulating layer 142, filling a space between the preliminary channel layers 140', may be formed. The preliminary channel layer 140' may include silicon having an amorphous structure or a polycrystalline structure. A chemical mechanical polishing (CMP) process may be performed to remove a portion of the preliminary channel layer 140' and the channel filling insulating layer 142. Referring to FIG. 10B, due to dishing caused by the CMP process, a region in which the preliminary channel layer 140' and the channel filling insulating layer 142 are disposed may be recessed by a desired and/or alternatively predetermined depth as compared with a region in which the gate dielectric layer 143 is disposed, but shapes of the preliminary channel layer 140', the channel filling insulating layer 142, and the gate dielectric layer 143 are not limited thereto.

Figure 11:
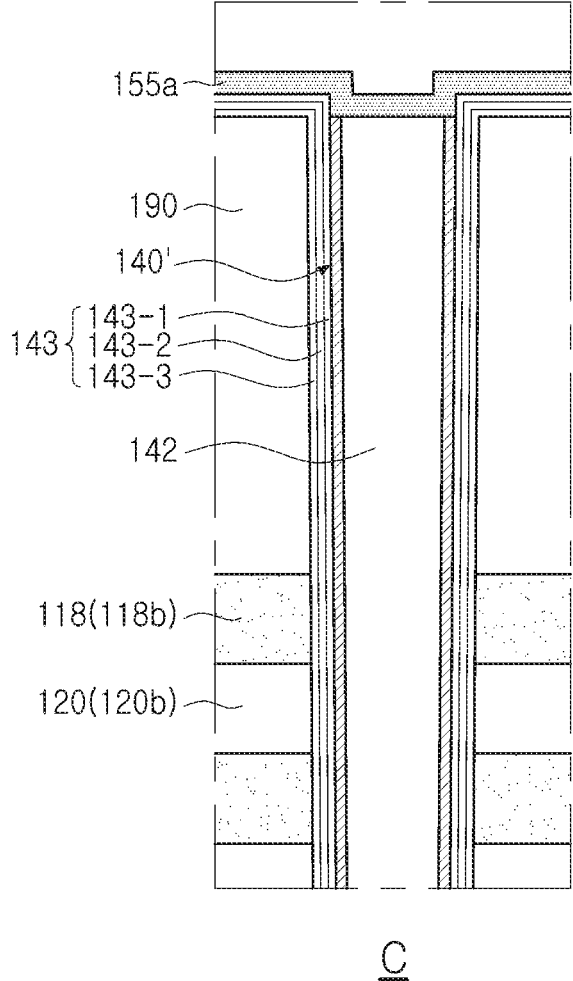

Referring to FIG. 11, a first metal layer 155a may be formed. The first metal layer 155a may be formed to conformally cover the preliminary channel layer 140', the channel filling insulating layer 142, and the gate dielectric layer 143 by performing a deposition process. In some embodiments, the first metal layer 155a may be formed to be selectively deposited on only an upper surface of the preliminary channel layer 140'. The first metal layer 155a may include a metal material, for example, nickel (Ni), cobalt (Co), platinum (Pt), palladium (Pd), or combinations thereof.

Figure 12:
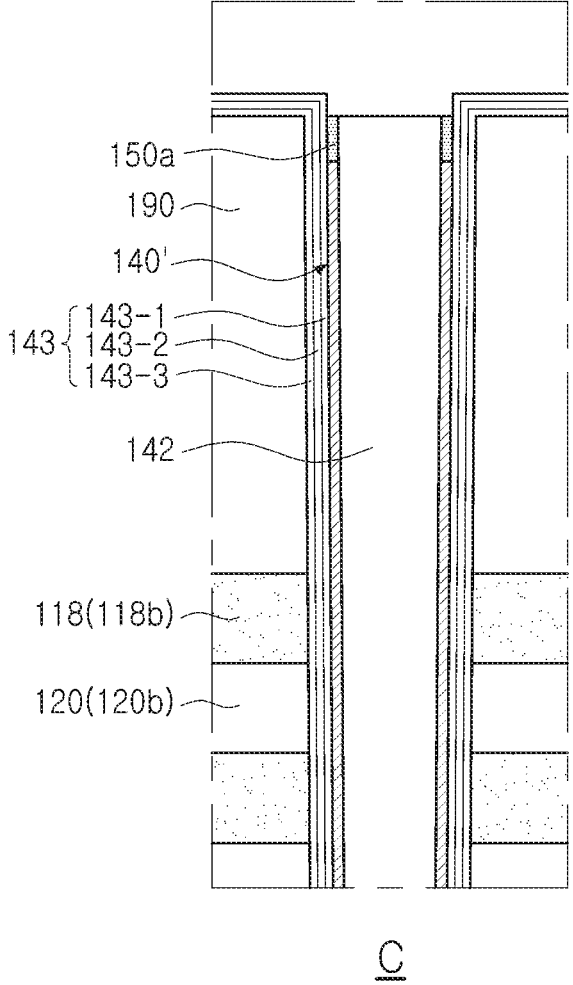

Referring to FIG. 12, a first metal-semiconductor compound layer 150a may be formed, and a remaining first metal layer 155a may be removed. The first metal-semiconductor compound layer 150a may be formed by performing a heat treatment process such as annealing to react the preliminary channel layer 140' with the first metal layer 155a. In an example embodiment, when the preliminary channel layer 140' includes amorphous silicon and the first metal layer 155a includes nickel, the first metal-semiconductor compound layer 150a may include nickel silicide. The first metal-semiconductor compound layer 150a is illustrated as having substantially the same thickness as the preliminary channel layer 140', but may be modified to have a higher thickness than the preliminary channel layer 140' in the heat treatment process according to example embodiments. Then, the remaining first metal layer 155a may be removed.

Referring to FIG. 13, a portion of the preliminary channel layer 140' may be crystallized to form a first semiconductor material layer 140a.

A heat treatment process such as annealing may be performed to crystallize a portion of the preliminary channel layer 140' using the first metal-semiconductor compound layer 150a. The first metal-semiconductor compound layer 150a rearrange a crystal structure of the preliminary channel layer 140' while diffusing in a first crystallization direction toward the base substrate SUB along the preliminary channel layer 140' by the heat treatment process. That is, at least a portion of the preliminary channel layer 140', for example, a region with which the first metal-semiconductor compound layer 150a reacts while passing therethrough may be changed into the first semiconductor material layer 140a. The first semiconductor material layer 140a may have a crystal structure having better electrical characteristics than the preliminary channel layer 140'. The first semiconductor material layer 140a may have a single crystal structure or a single crystal-like structure.

In an example embodiment, as the first metal-semiconductor compound layer 150a moves in the first crystallization direction, a portion of the metal elements may be diffused or consumed to decrease a size of the first metal-semiconductor compound layer 150a.

In the present operation, the first metal-semiconductor compound layer 150a may be fixed to the target region by adjusting the process conditions of the heat treatment process, for example, heat treatment temperature or process time. The target region may be a location adjacent to a boundary between the first channel structure CH1 and the second channel structure CH2, as described with reference to FIG. 2A. This may be because, when the first metal-semiconductor compound layer 150a overlaps the memory gate electrodes 130M (see FIG. 2A) in a horizontal direction, electrical characteristics may be deteriorated.

The process operations described in FIGS. 11 to 13 may be referred to as a first crystallization operation.

In the present operation, the first metal-semiconductor compound layer 150a may be completely consumed by adjusting the process conditions of the heat treatment process or adjusting the process conditions of the deposition process of FIG. 11 or the heat treatment process of FIG. 12. Accordingly, the semiconductor device 100b of FIG. 5 or the semiconductor device 100c of FIG. 6 may be provided.

Referring to FIG. 14, a gate electrode 130 may be formed, and an upper interconnection structure and an upper bonding structure may be formed.

A portion of the channel filling insulating layer 142 may be removed, and the removed portion may be filled with a conductive material to form a channel pad 144. Thus, channel structures CH may be formed. The conductive material may include, for example, doped polycrystalline silicon.

A cell region insulating layer 190 may be further formed, openings may be performed to penetrate through the preliminary stack structure GS', and the sacrificial insulating layers 118 exposed through the openings may be selectively etched with respect to the interlayer insulating layers 120. The openings may be formed in regions corresponding to first and second separation regions MS1, MS2a, and MS2b (see FIG. 1), and may be in the form of a trench extending in the X-direction. The sacrificial insulating layers 118 may be selectively removed with respect to the interlayer insulating layers 120 using, for example, a wet etching process.

Gate electrodes 130 may be formed in a region in which the sacrificial insulating layers 118 are removed. In an example embodiment, an auxiliary gate dielectric layer may be formed to conformally cover the interlayer insulating layers 120 before the gate electrodes 130 are formed, but example embodiments are not limited thereto. The gate electrodes 130 may be formed by filling a conductive material in a region, in which the sacrificial insulating layers 118 are removed, and performing an etching process on the conductive material filling the openings. The conductive material may include a metal, polycrystalline silicon, or a metal silicide material. The openings may be filed with an insulating material to form a separation insulating layer 105 (see FIG. 2A).

An upper interconnection structure and an upper bonding structure may be formed on the gate electrodes 130. In the upper interconnection structure, the gate contacts 160 and the substrate contact 165 may be formed by etching a cell region insulating layer 190 on the gate electrodes 130 and a second preliminary substrate 101' to form contact holes and filling the contact holes with a conductive material. The cell contact plugs 170 may be formed by etching the cell region insulating layer 190 and depositing a conductive material on the channel pad 144, the gate contacts 160, and the substrate contact 165. The cell interconnection lines 180 may be formed in a deposition and patterning processes of a conductive material, or may be formed by forming a portion of an insulating layer constituting the cell region insulating layer 190, patterning the portion of the insulating layer, and depositing a conductive material.

Second bonding vias 195 and second bonding metal layers 198, constituting the upper bonding structure, may be formed by further forming the cell region insulating layer 190 on the cell interconnection lines 180 and removing a portion of the cell region insulating layer 190. Upper surfaces of the second bonding metal layers 198 may be exposed from the cell region insulating layer 190.

Referring to FIG. 15, a first semiconductor structure 51 and a second semiconductor structure S2 may be bonded to each other.

The first semiconductor structure 51 and the second semiconductor structure S2 may be connected by pressurizing first bonding metal layers 298 and second bonding metal layers 198 to be bonded to each other. At the same time, bonding insulating layers, portions of the peripheral region insulating layer 290 and the cell region insulating layer 190, may also be pressurized to be bonded to each other. Bonding may be performed after the second semiconductor structure S2 is turned over on the first semiconductor structure 51 such that the second bonding metal layers 198 face downwardly. In the drawings, for better understanding, the second semiconductor structure S2 is illustrated as being bonded in the form of a mirror image of the structure illustrated in FIG. 14.

The first semiconductor structure 51 and the second semiconductor structure S2 may be directly bonded to each other without intervention of an adhesive such as an additional adhesive layer. According to example embodiments, prior to the bonding, a surface treatment process such as a hydrogen plasma treatment may be further performed on an upper surface of the first semiconductor structure S1 and a lower surface of the second semiconductor structure S2 to improve bonding strength.

Referring to FIG. 16, the base substrate SUB and the second preliminary substrate 101' may be removed.

The base substrate SUB may be removed by a polishing process such as a grinding process. A portion of the second preliminary substrate 101' may be removed together with the base substrate SUB in the grinding process.

The second preliminary substrate 101' may be selectively etched with respect to channel structures CH and a substrate contact 65 to expose at least a portion of the channel structures CH, extending inwardly of the second preliminary substrate 101', and the substrate contact 165. In the example embodiment, the second preliminary substrate 101' is illustrated as being entirely removed, but a portion of the second preliminary substrate 101' may remain or a portion of an uppermost interlayer insulating layer 120a may be etched together with the entire second preliminary substrate 101'.

Figure 17:
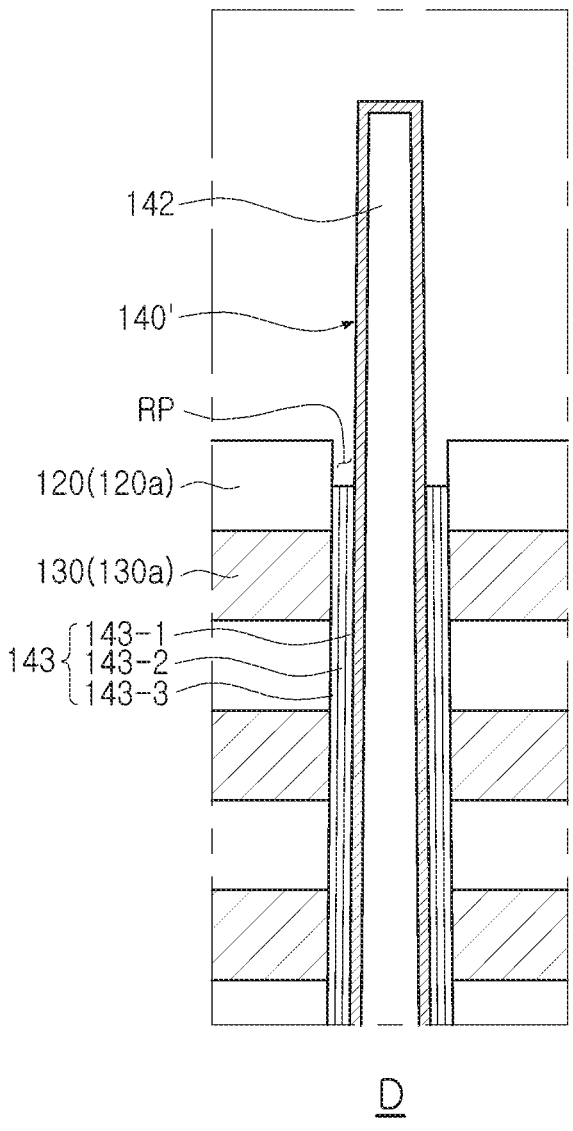

Referring to FIG. 17, a portion of the gate dielectric layer 143 may be removed.

As the second preliminary substrate 101' is removed, an etching process may be selectively performed on the exposed gate dielectric layer 143 to expose the preliminary channel layer 140'. In an example embodiment, to relatively increase an area of the exposed preliminary channel layer 140', the gate dielectric layer 143 may be further etched by a desired and/or alternatively predetermined depth to form a recess region RP. Accordingly, an upper surface of the gate dielectric layer 143 may be disposed on a level, lower than a level of an upper surface of the uppermost interlayer insulating layer 120a.

Figure 18:
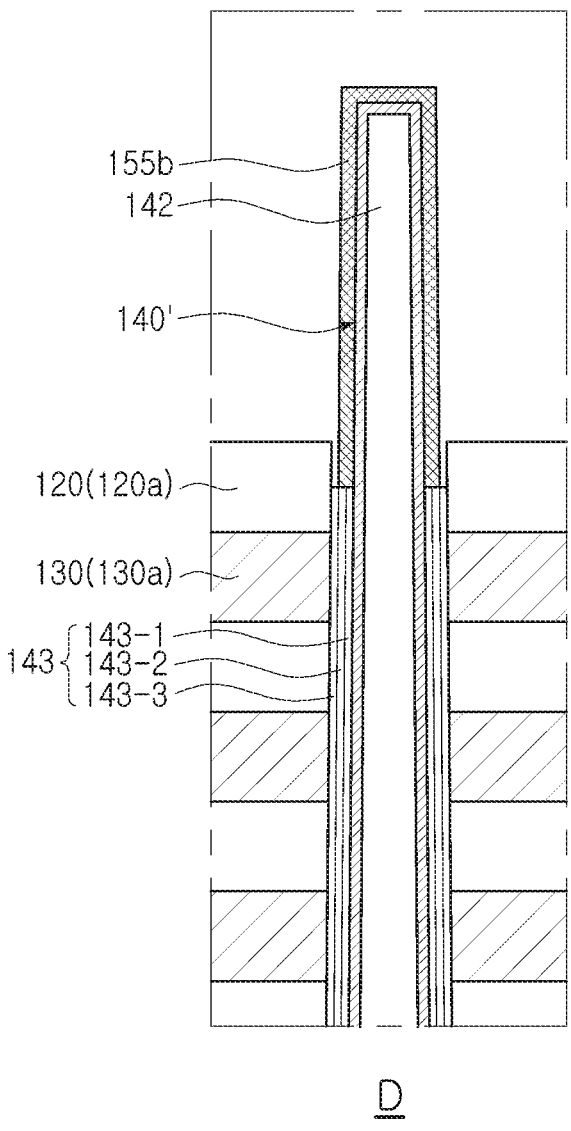

Referring to FIG. 18, a second metal layer 155b may be formed on the exposed preliminary channel layer 140'.

The second metal layer 155b may be formed by performing a deposition process to selectively form a metal material on the preliminary channel layer 140'. In some embodiments, the second metal layer 155b may be formed to conformally cover the exposed uppermost interlayer insulating layer 120 including the preliminary channel layer 140'. The second metal layer 155b may include a metal material, for example, nickel (Ni), cobalt (Co), platinum (Pt), palladium (Pd), or combinations thereof. The second metal layer 155b may include the same material as the first metal layer 155a (refer to FIG. 11), but example embodiments are not limited thereto.

Figure 19:
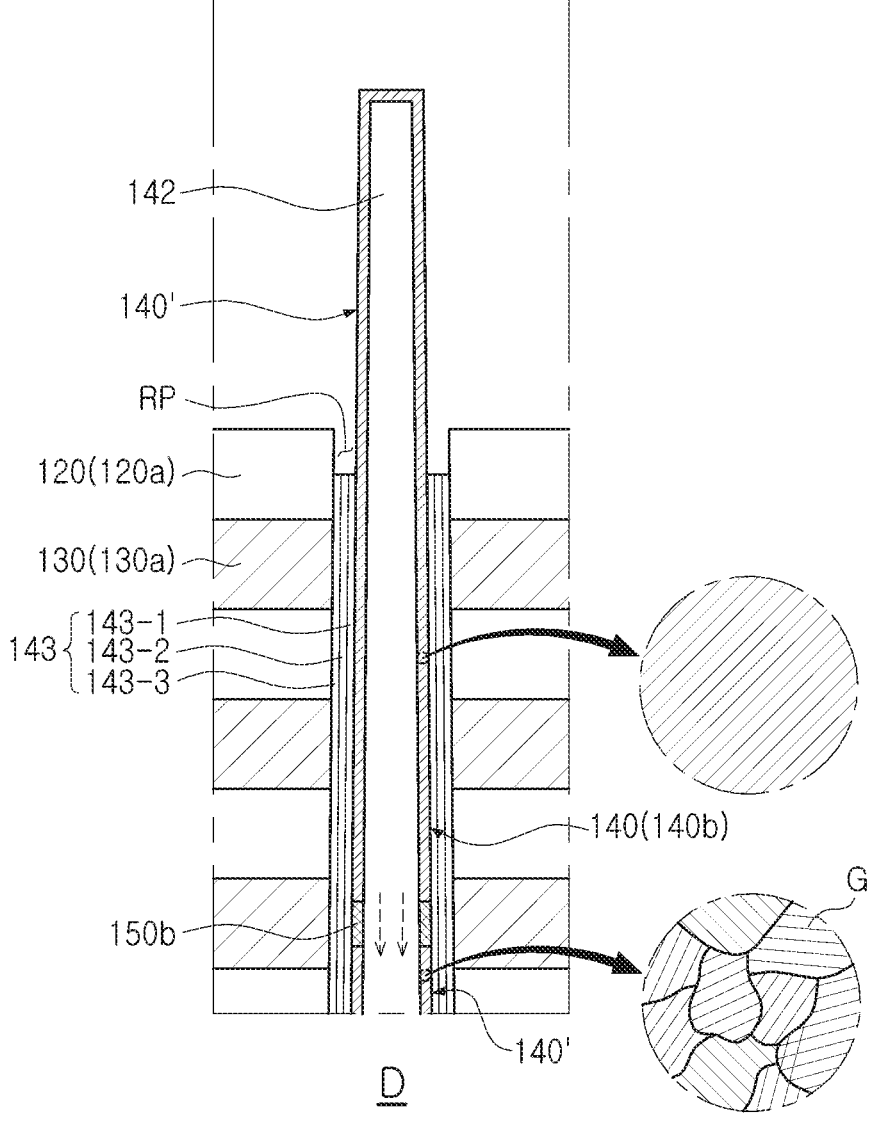

Referring to FIG. 19, a second metal-semiconductor compound layer 150b may be formed, and the remaining preliminary channel layer 140' may be crystallized to form the second semiconductor material layer 140b.

The second metal-semiconductor compound layer 150b may be formed by performing a heat treatment process, such as an annealing process, on the second metal layer 155b in contact with the preliminary channel layer 140'. The second metal-semiconductor compound layer 150b may include metal elements of the second metal layer 155b and semiconductor elements of the preliminary channel layer 140'. In an example embodiment, the second metal layer 155b remaining after performing the heat treatment process may be removed, but example embodiments are not limited thereto.

By performing a heat treatment process such as an annealing process to move the second metal-semiconductor compound layer 150b, the remaining preliminary channel layer 140' may be crystallized. The second metal-semiconductor compound layer 150b may rearrange a crystal structure of the preliminary channel layer 140' while diffusing along the preliminary channel layer 140' in a second crystallization direction toward the channel pad 144 through the heat treatment process. For example, a region, with which the second metal-semiconductor compound layer 150b reacts while passing therethrough, of the preliminary channel layer 140' may be changed into a second semiconductor material layer 140b. The second semiconductor material layer 140b may have a crystal structure having better electrical characteristics than the preliminary channel layer 140'. The second semiconductor material layer 140b may have a single crystal structure or a single crystal-like structure.

In an example embodiment, as the second metal-semiconductor compound layer 150b is diffused in the second crystallization direction, a portion of the metal elements may be consumed to decrease a size of the second metal-semiconductor compound layer 150b.

In the present operation, the second metal-semiconductor compound layer 150b may be formed in a target region by adjusting the process conditions of the heat treatment process, for example, heat treatment temperature or process time. The target region may be a location adjacent to a boundary between the first channel structure CH1 and the second channel structure CH2, as described with reference to FIG. 2A.

The process operations, described in FIGS. 18 and 19, may be referred to as a second crystallization operation. The second crystallization operation may address an issue such as an increase in crystallization difficulty resulting from an increase in the number of gate electrodes. As an aspect ratio of the channel structure is also increased due to the increase in the number of the gate electrodes, difficulty of a process of crystallizing the entire preliminary channel layer 140' may be increased by only the first crystallization operation described with reference to FIGS. 11 to 13. Accordingly, the second crystallization operation may be performed together with the first crystallization operation to relatively easily crystallize the entire preliminary channel layer 140'. As a result, a channel layer having a single crystal structure or a single crystal-like structure may be provided to a semiconductor device having improved electrical characteristics.

Referring to FIG. 2A together, a second substrate 101 may be formed to cover the channel layer 140 and the uppermost interlayer insulating layer 120a may be formed. The second substrate 101 may include a semiconductor material, for example, polycrystalline silicon. In an example embodiment, the second substrate 101 may include impurities. A passivation layer 199 may be formed on the second substrate 101 to ultimately fabricate the semiconductor device 100 of FIGS. 2A and 2B.

Figure 20:
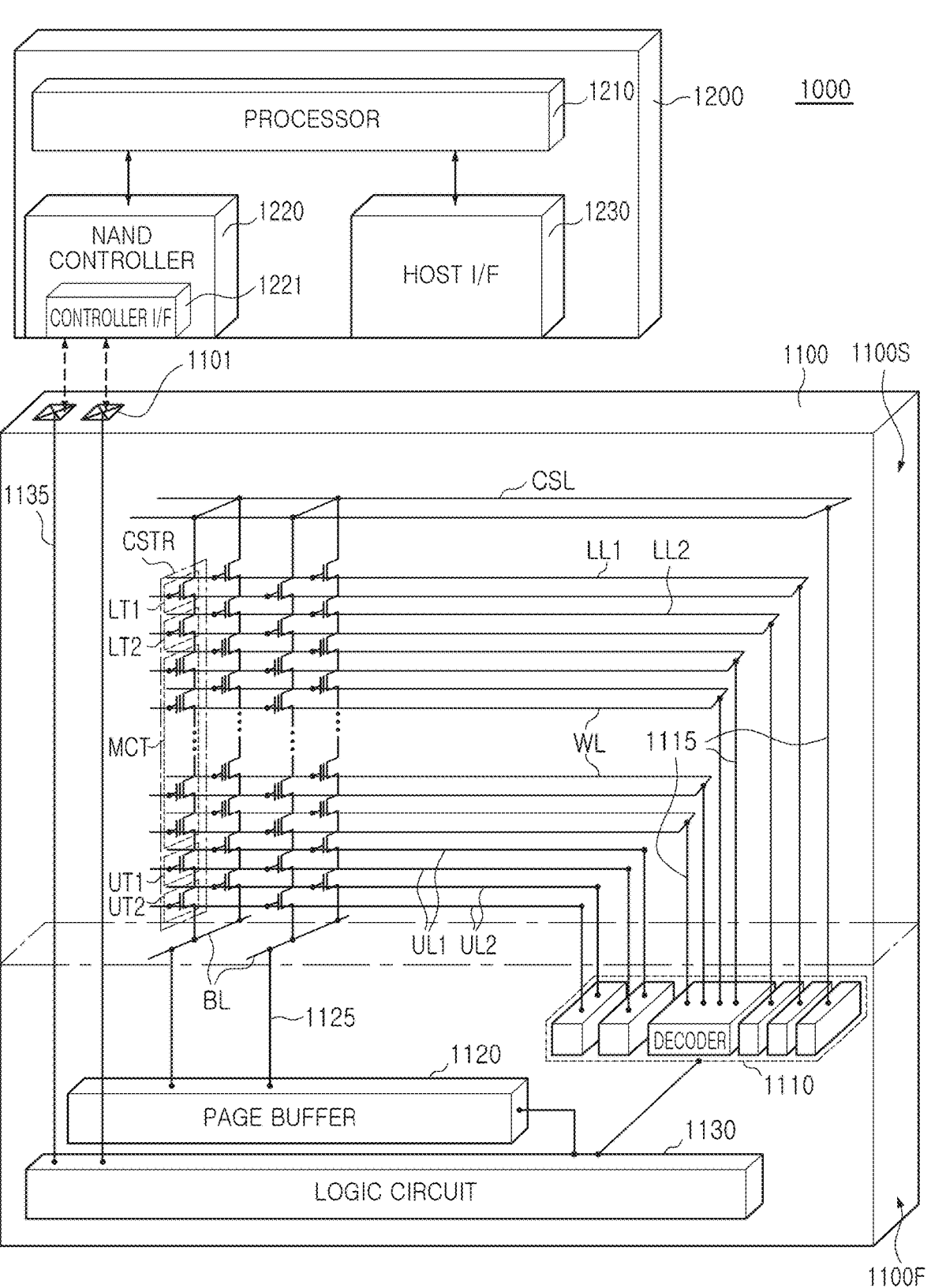
FIG. 20 is a schematic view of a data storage system including a semiconductor device according to example embodiments.

FIG. 20 is a schematic view of a data storage system 1000 including a semiconductor device according to example embodiments.

Referring to FIG. 20, the data storage system 1000 may include a semiconductor device 1100 and a controller 1200 electrically connected to the semiconductor device 1100. The data storage system 1000 may be a storage device including a single or a plurality of semiconductor devices 1100 or an electronic device including a storage device. For example, the data storage system 1000 may be a solid state drive (SSD) device including a single or a plurality of semiconductor devices 1100, a universal serial bus (USB), a computing system, a medical device, or a communication device.

The semiconductor device 1100 may be a nonvolatile memory device, for example, the NAND flash memory device described above with reference to FIGS. 1 to 8. The semiconductor device 1100 may include a first structure 1100F and a second structure 1100S on the first structure 1100F. The first structure 1100F may be a peripheral circuit structure including a decoder circuit 1110, a page buffer 1120, and a logic circuit 1130. The second structure 1100S may be a memory cell structure including a bitline BL, a common source line CSL, wordlines WL, first and second gate upper lines UL1 and UL2, first and second gate lower lines LL1 and LL2, and memory cell strings CSTR disposed between the bitline BL and the common source line CSL.

In the second structure 1100S, each of the memory cell strings CSTR may include lower transistors LT1 and LT2 adjacent to the common source line CSL, upper transistors UT1 and UT2 adjacent to the bitline BL, and a plurality of memory cell transistors MCT disposed between the lower transistors LT1 and LT2 and the upper transistors UT1 and UT2. The number of lower transistors LT1 and LT2 and the number of upper transistors UT1 and UT2 may vary according to example embodiments.

In example embodiments, the upper transistors UT1 and UT2 may include a string select transistor, and the lower transistors LT1 and LT2 may include a ground select transistor. The gate lower lines LL1 and LL2 may be gate electrodes of the lower transistors LT1 and LT2, respectively. The wordlines WL may be gate electrodes of the memory cell transistors MCT, respectively. The gate upper lines UL1 and UL2 may be gate electrodes of the upper transistors UT1 and UT2, respectively.

In example embodiments, the lower transistors LT1 and LT2 may include a lower erase control transistor LT1 and a ground select transistor LT2 connected to each other in series. The upper transistors UT1 and UT2 may include a string select transistor UT1 and an upper erase control transistor UT2 connected to each other in series. At least one of the lower erase control transistor LT1 and the upper erase control transistor UT1 may be used in an erase operation to erase data stored in the memory cell transistors MCT using a gate-induced drain leakage current (GIDL) phenomenon.

The common source line CSL, the first and second gate lower lines LL1 and LL2, the wordlines WL, and the first and second gate upper lines UL1 and UL2 may be electrically connected to the decoder circuit 1110 through first connection wiring 1115 extending from the first structure 1100F to the second structure 1100S. The bitlines BL may be electrically connected to the page buffer 1120 through second connection wiring 1125 extending from the first structure 110F to the second structure 1100S.

In the first structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1000 may communicate with the controller 1200 through the input/output pad 1101 electrically connected to the logic circuit 1130. The input/output pad 1101 may be electrically connected to the logic circuit 1130 through an input/output connection wiring 1135 extending from the first structure 1100F to the second structure 1100S.

The controller 1200 may include a processor 1210, a NAND controller 1220, and a host interface 1230. In example embodiments, the data storage system 1000 may include a plurality of semiconductor devices 1100. In this case, the controller 1200 may control the plurality of semiconductor devices 1000.

The processor 1210 may control overall operation of the data storage system 1000 including the controller 1200. The processor 1210 may operate according to a desired and/or alternatively predetermined firmware, and may control the NAND controller 1220 to access the semiconductor device 1100. The NAND controller 1220 may include a NAND interface 1221 processing communication with the semiconductor device 1100. A control command for controlling the semiconductor device 1100, data to be written to the memory cell transistors MCT of the semiconductor device 1100, and data to be read from the memory cell transistors MCT of the semiconductor device 1100 may be transmitted through the NAND interface 1221. The host interface 1230 may provide a communication function between the data storage system 1000 and an external host. When a control command from an external host is received through the host interface 1230, the processor 1210 may control the semiconductor device 1100 in response to the control command.

Figure 21:
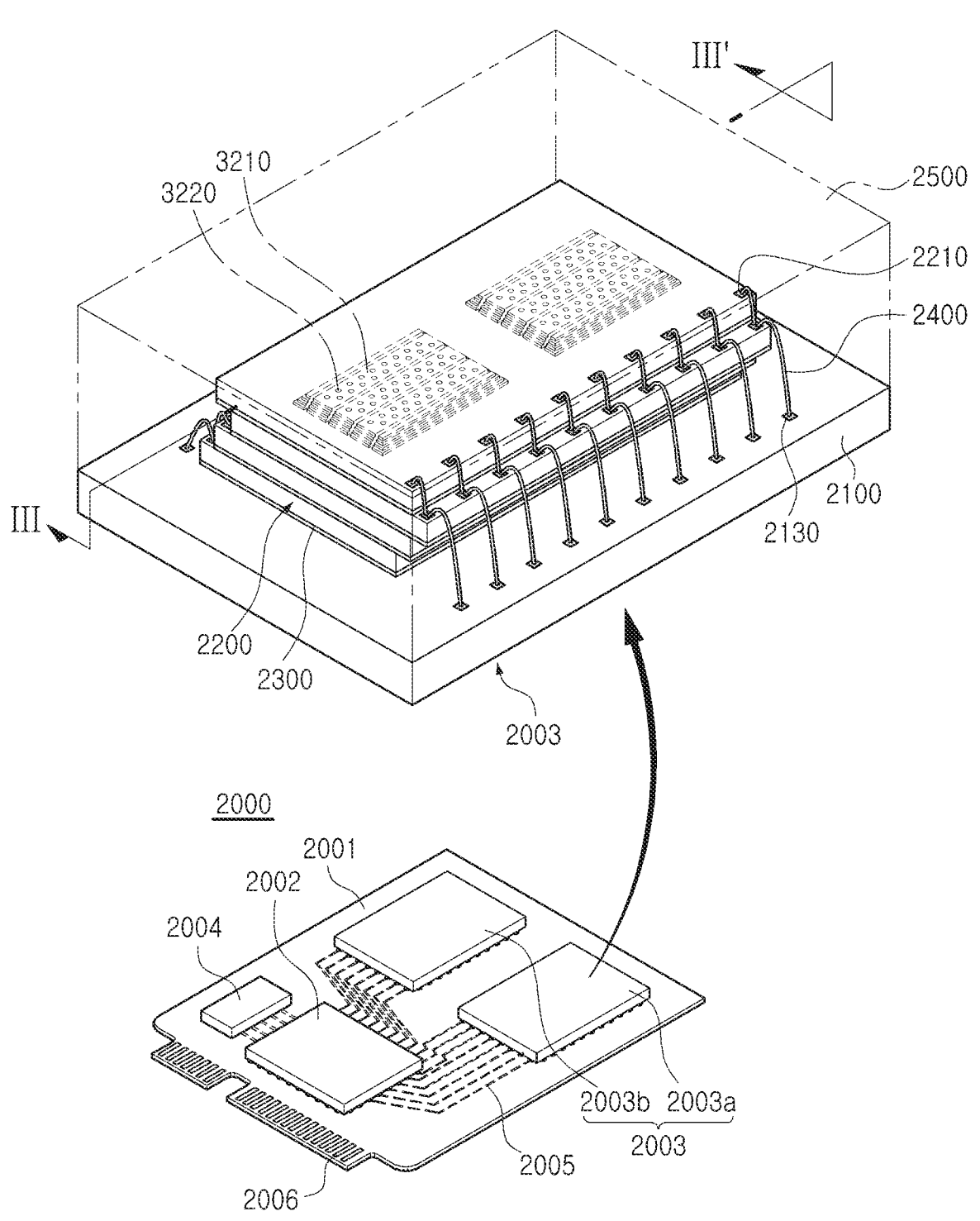
FIG. 21 is a schematic perspective view of a data storage system including a semiconductor device according to an example embodiment.

FIG. 21 is a schematic perspective view of a data storage system including a semiconductor device according to an example embodiment.

Referring to FIG. 21, a data storage system 2000 according to an example embodiment may include a main substrate 2001, a controller 2002 mounted on the main substrate 2001, one or more semiconductor packages 2003, and a DRAM 2004. The semiconductor package 2003 and the DRAM 2004 may be connected to the controller 2002 by wiring patterns 2005 formed on the main substrate 2001.

The main substrate 2001 may include a connector 2006 including a plurality of pins coupled to an external host. The number and arrangement of the plurality of pins in the connector 2006 may vary depending on a communication interface between the data storage system 2000 and the external host. In example embodiments, the data storage system 2000 may communicate with an external host according to one of interfaces from among universal serial bus (USB), peripheral component interconnect express (PCI-Express), serial advanced technology attachment (SATA), M-PHY for universal flash storage (UFS). In example embodiments, the data storage system 2000 may operate by power supplied from an external host through the connector 2006. The data storage system 2000 may further include a power management integrated circuit (PMIC) for distributing power supplied from the external host to the controller 2002 and the semiconductor package 2003.

The controller 2002 may write data to or may read data from the semiconductor package 2003, and may improve an operating speed of the data storage system 2000.

The DRAM 2004 may be configured as a buffer memory for alleviating a difference in speeds between the semiconductor package 2003, which is a data storage space, and an external host. The DRAM 2004 included in the data storage system 2000 may operate as a cache memory, and may provide a space for temporarily storing data in a control operation for the semiconductor package 2003. When the data storage system 2000 includes the DRAM 2004, the controller 2002 may further include a DRAM controller for controlling the DRAM 2004 in addition to the NAND controller for controlling the semiconductor package 2003.

The semiconductor package 2003 may include first and second semiconductor packages 2003a and 2003b spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, semiconductor chips 2200 on the package substrate 2100, adhesive layers 2300, respectively disposed on lower surfaces of the semiconductor chips 2200, a connection structure 2400 electrically connecting the semiconductor chips 2200 to the package substrate 2100, and a molding layer 2500 covering the semiconductor chips 2200 and the connection structure 2400 on the package substrate 2100.

The package substrate 2100 may be a printed circuit board including package upper pads 2130. Each of the semiconductor chip 2200 may include an input/output pad 2210. The input/output pad 2210 may correspond to the input/output pad 1101 of FIG. 20. Each of the semiconductor chips 2200 may include gate stack structures 3210 and channel structures 3220. Each of the semiconductor chips 2200 may include the semiconductor device described above with reference to FIGS. 1 to 8.

In example embodiments, the connection structure 2400 may be configured as a bonding wire electrically connecting the input/output pad 2210 to the upper package pads 2130. Accordingly, in each of the first and second semiconductor packages 2003a and 2003b, the semiconductor chips 2200 may be electrically connected to each other by a wire bonding method, and may be electrically connected to the package upper pads 2130 of the package substrate 2100. In example embodiments, in each of the first and second semiconductor packages 2003a and 2003b, the semiconductor chips 2200 may be electrically connected to each other by a connection structure including a through-silicon via (TSV), rather than the connection structure 2400 of a wire bonding method.

In example embodiments, the controller 2002 and the semiconductor chips 2200 may be included in a single package. In an example embodiment, the controller 2002 and the semiconductor chips 2200 may be mounted on an additional interposer substrate, different from the main substrate 2001, and the controller 2002 and the semiconductor chips 2200 may be connected to each other by a wiring formed on the interposer substrate.

Figure 22:
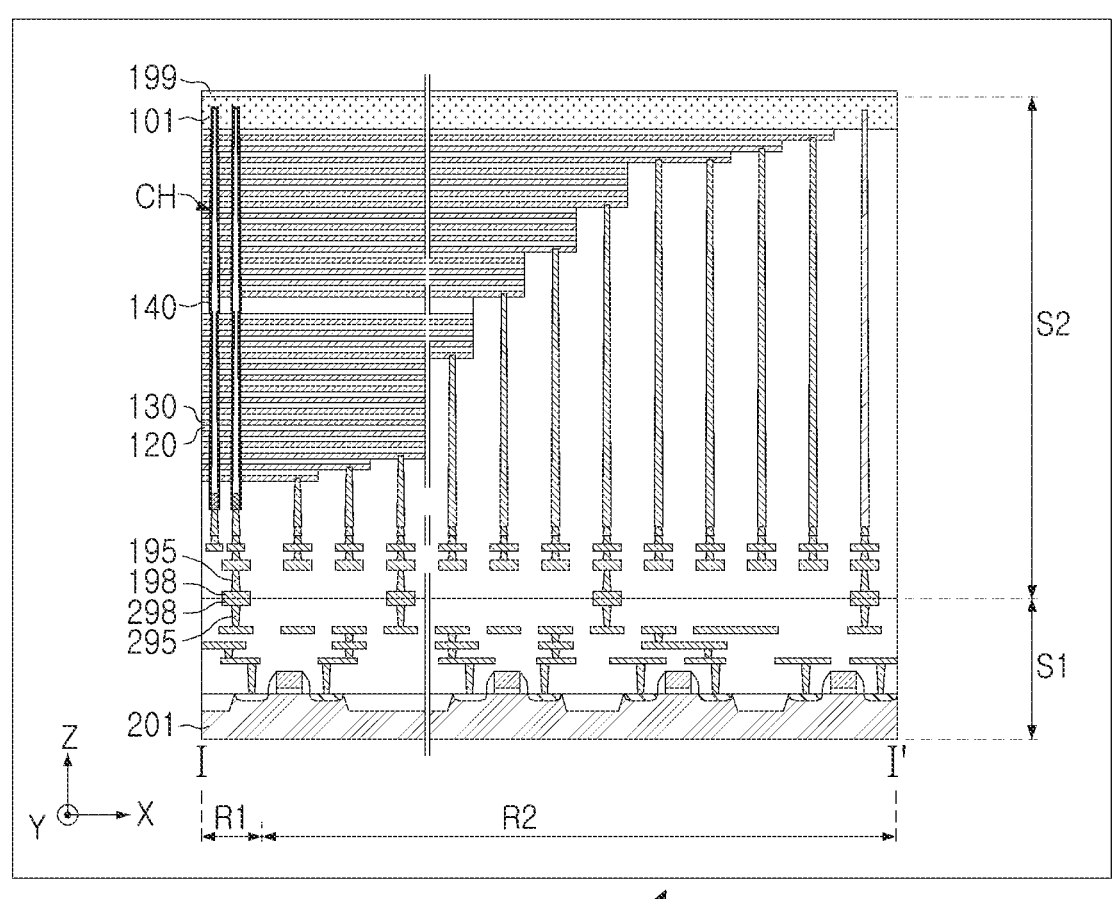
FIG. 22 is a schematic cross-sectional view of a semiconductor package according to an example embodiment.
Figure 22:
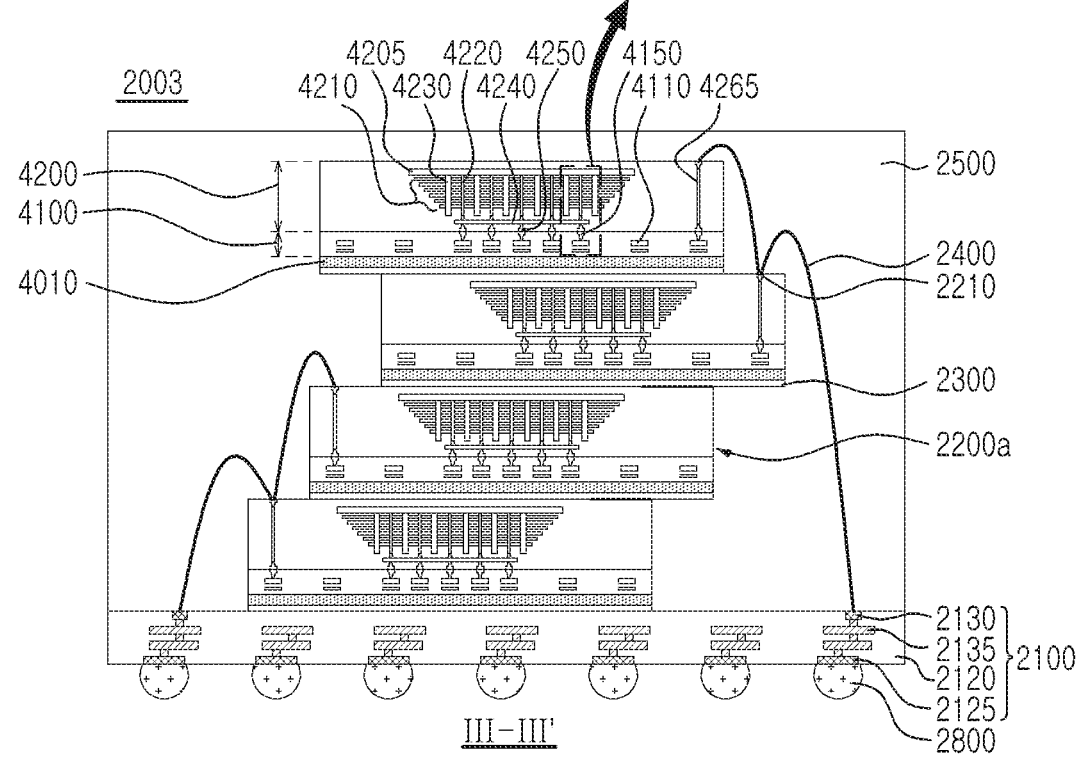

FIG. 22 is a schematic cross-sectional view of a semiconductor package according to an example embodiment. FIG. 22 illustrates an example embodiment of the semiconductor package 2003 of FIG. 21, and conceptually illustrates a region of the semiconductor package 2003 taken along line III-III'.

Referring to FIG. 22, in a semiconductor package 2003, a package substrate 2100 may be a printed circuit board. The package substrate 2100 may include a package substrate body 2120, package upper pads 2130 (see FIG. 21) disposed on an upper surface of a package substrate body portion 2120, package lower pads 2125 disposed on a lower surface of the package substrate body portion 2120 or exposed through the lower surface, and internal wirings 2135 electrically connecting the package upper pads 2130 to the package lower pads 2125 in the package substrate body portion 2120. The package upper pads 2130 may be electrically connected to the connection structures 2400. The package lower pads 2125 may be connected to the wiring patterns 2005 of the main substrate 2010 of the data storage system 2000, as illustrated in FIG. 20, through conductive connection portions 2800.

In the semiconductor package 2003, each semiconductor chip 2200a may include a semiconductor substrate 4010, a first structure 4100 on the semiconductor substrate 4010, and a second structure 4200 bonded to the first structure 4100 on the first structure 4100 by a wafer bonding method.

The first structure 4100 may include a peripheral circuit region including a peripheral wiring 4110 and the first bonding structures 4150. The second structure 4200 includes a common source line 4205, a gate stack structure 4210 between the common source line 4205 and the first structure 4100, and channel structures 4220 and a separation region 4230 penetrating through the gate stack structure 4210, and second bonding structures 4250, respectively electrically connected to the wordlines (WL of FIG. 20) of the memory channel structures 4220 and the gate stack structure 4210. For example, the second junction structures 4250 may be electrically connected to memory channel structures 4220 and the wordlines (WL of FIG. 20) through bitlines 4240 electrically connected to the memory channel structures 4220 and gate contacts 160 (see FIG. 2A) electrically connected to the wordlines (WL of FIG. 20), respectively. The first bonding structures 4150 of the first structure 4100 and the second bonding structures 4250 of the second structure 4200 may be bonded to each other while being in contact with each other. Bonded portions of the first bonding structures 4150 and the second bonding structures 4250 may be formed of, for example, copper (Cu).

As illustrated in the enlarged view, the second structure 4200 may include channel structures CH penetrating through gate electrodes 130 and interlayer insulating layers 120. In each semiconductor chip 2200a, each of the channel structures CH may include first and second semiconductor material layers 140a and 140b having a single crystal structure or a single crystal-like structure, as described above with reference to FIGS. 1 to 8. Accordingly, a channel layer 140 having improved electrical characteristics and a semiconductor chips 2200a including the channel layer 140 may be provided.

The semiconductor chips 2200a may be electrically connected to each other by bonding wire-type connection structures 2400. However, in example embodiments, semiconductor chips in a single semiconductor package such as the semiconductor chips 2200a may be electrically connected to each other by a connection structure including a through-silicon via (TSV).

As described above, in a structure in which two or more semiconductor structures are bonded to each other, a bonding process for the bonding may be performed and a metal inducted lateral crystallization (MILC) process may then be additionally performed to increase a crystallization region of a channel layer. Accordingly, a semiconductor device having improved electrical characteristics and a data storage system including the semiconductor device may be provided.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While example embodiments have been shown and described above, it will be apparent to those skilled in the art that modifications and variations could be made without departing from the scope of inventive concepts as defined by the appended claims.

What is claimed is:

1. A semiconductor device comprising:
a first semiconductor structure including a first substrate, a plurality of circuit devices on the first substrate, a lower interconnection structure electrically connected to the plurality of circuit devices, and a lower bonding structure connected to the lower interconnection structure; and
a second semiconductor structure including a second substrate on the first semiconductor structure, a stack structure below the second substrate and including a plurality of gate electrodes and a plurality interlayer insulating layers alternately stacked in a vertical direction, and a plurality of channel structures penetrating through the stack structure and extending in the vertical direction, an upper interconnection structure below the stack structure, and an upper bonding structure connected to the upper interconnection structure and bonded to the lower bonding structure, wherein
the vertical direction is perpendicular to the second substrate,
each of the plurality of channel structures includes a channel layer,
the stack structure includes a first stack structure and a second stack structure below the first stack structure,
the plurality of channel structures each includes a first channel structure and a second channel structure,
the first channel structure penetrates through the first stack structure, the second channel structure penetrates through the second stack structure, and
the plurality of channel structures each further include a metal-semiconductor compound layer in a region of the channel layer adjacent to a boundary between the first channel structure and the second channel structure.

2. The semiconductor device of claim 1, wherein
the channel layer includes a first semiconductor material layer above the metal-semiconductor compound layer and a second semiconductor material layer below the metal-semiconductor compound layer, and
the first semiconductor material layer and the second semiconductor material layer each have a single crystal structure or a single crystal-like structure.

3. The semiconductor device of claim 2, wherein
the first semiconductor material layer is in contact with an upper surface of the metal-semiconductor compound layer,
the second semiconductor material layer is in contact with a lower surface of the metal-semiconductor compound layer, and
the metal-semiconductor compound layer, the first semiconductor material layer, and the second semiconductor material layer are electrically connected to each other.

4. The semiconductor device of claim 2, wherein
an external side surface of the first semiconductor material layer and an external side surface of the second semiconductor material layer are coplanar with an external side surface of the metal-semiconductor compound layer, and
each of the plurality of channel structures further includes a gate dielectric layer surrounding the external side surface of the first semiconductor material layer, the external side surface of the second semiconductor material layer, and the external side surface of the metal-semiconductor compound layer.

5. The semiconductor device of claim 4, wherein
at least one of the plurality of channel structures penetrates through the stack structure and extends into the second substrate,
in at least one of the plurality of channel structures, an upper end portion of the channel layer is in direct contact with the second substrate, and
in at least one of the plurality of channel structures, a lower end portion of the channel layer is surrounded by the gate dielectric layer.

6. The semiconductor device of claim 1, wherein
the metal-semiconductor compound layer is on a level between a lowermost gate electrode of the first stack structure and an uppermost gate electrode of the second stack structure, and
the lowermost gate electrode of the first stack structure and the uppermost gate electrode of the second stack structure are among the plurality of gate electrodes in the second semiconductor structure.

7. The semiconductor device of claim 1, wherein
the metal-semiconductor compound layer has a length of about 10 nm or less in the vertical direction.

8. The semiconductor device of claim 1, wherein
the metal-semiconductor compound layer includes at least one of nickel (Ni), cobalt (Co), platinum (Pt), and palladium (Pd).

9. The semiconductor device of claim 1, wherein
the channel layer includes a first semiconductor material layer above the metal-semiconductor compound layer and a second semiconductor material layer below the metal-semiconductor compound layer, the metal-semiconductor compound layer includes a first metal-semiconductor compound layer contacting the first semiconductor material layer and a second metal-semiconductor compound layer contacting the second semiconductor material layer.

10. The semiconductor device of claim 9, wherein the first metal-semiconductor compound layer and the second metal-semiconductor compound layer are in contact with each other.

11. The semiconductor device of claim 9, wherein the first metal-semiconductor compound layer and the second metal-semiconductor compound layer are spaced apart from each other, and the channel layer further includes a third semiconductor material layer between the first metal-semiconductor compound layer and the second metal-semiconductor compound layer.

12. The semiconductor device of claim 11, wherein a grain size of the third semiconductor material layer is smaller than a grain size of the first semiconductor material layer and a grain size of the second semiconductor material layer.

13. The semiconductor device of claim 12, wherein the grain size of the first semiconductor material layer and the grain size of the second semiconductor material layer are within about 5 μm or more, and the grain size of the third semiconductor material layer is about 0.4 μm or less.

14. A semiconductor device comprising:
a first substrate;
a plurality of circuit devices on the first substrate;
a lower interconnection structure electrically connected to the plurality of circuit devices;
a lower bonding structure connected to the lower interconnection structure;
an upper bonding structure bonded to the lower bonding structure;
an upper interconnection structure connected to the upper bonding structure;
a second substrate on the upper interconnection structure;
a plurality of gate electrodes between the upper interconnection structure and the second substrate, the plurality of gate electrodes being spaced apart from each other and stacked in a vertical direction, and the plurality of gate electrodes including a plurality of first gate electrodes and a plurality of second gate electrodes below the plurality of first gate electrodes; and
a plurality of channel structures penetrating through the plurality of gate electrodes, each of the plurality of channel structures including a channel layer, wherein
the channel layer includes a first semiconductor material layer adjacent to the plurality of first gate electrodes and a second semiconductor material layer adjacent to the plurality of second gate electrodes, and
each of the first semiconductor material layer and the second semiconductor material layer has a single crystal structure or a single crystal-like structure.

15. The semiconductor device of claim 14, wherein the channel layer includes a third semiconductor material layer between the first semiconductor material layer and the second semiconductor material layer, the first semiconductor material layer, the second semiconductor material layer, and the third semiconductor material layer are electrically connected to each other, and the third semiconductor material layer has a polycrystalline structure or an amorphous structure.

16. The semiconductor device of claim 15, wherein the third semiconductor material layer is on a level between a lowermost gate electrode among the plurality of first gate electrodes and an uppermost gate electrode among the plurality of second gate electrodes.

17. The semiconductor device of claim 15, wherein at least one of the plurality of channel structures further includes a first metal-semiconductor compound layer between the third semiconductor material layer and the first semiconductor material layer and a second metal-semiconductor compound layer between the third semiconductor material layer and the second semiconductor material layer.

18. The semiconductor device of claim 17, wherein the first metal-semiconductor compound layer and the second metal-semiconductor compound layer include different metal elements.

19. A data storage system comprising:
a semiconductor storage device including a first substrate, a plurality of circuit devices on the first substrate, a lower interconnection structure electrically connected to the plurality of circuit devices, a lower bonding structure connected to the lower interconnection structure, an upper bonding structure bonded to the lower bonding structure, an upper interconnection structure connected to the upper bonding structure, a second substrate on the upper interconnection structure, a plurality of gate electrodes between the upper interconnection structure and the second substrate, a plurality of channel structures penetrating through the plurality of gate electrodes, and input/output pads electrically connected to the plurality of circuit devices; and
a controller electrically connected to the semiconductor storage device through the input/output pads, wherein
the controller is configured to control the semiconductor storage device,
the plurality of gate electrodes are spaced apart from each other and stacked in a vertical direction,
the plurality of gate electrodes include a plurality of first gate electrodes and a plurality of second gate electrodes below the plurality of first gate electrodes,
each of the channel structures includes a channel layer,
the channel layer includes a first semiconductor material layer adjacent to the plurality of first gate electrodes and a second semiconductor material layer adjacent to the plurality of second gate electrodes, and
each of the first semiconductor material layer and the second semiconductor material layer has a single crystal structure or a single crystal-like structure.

20. The data storage system of claim 19, wherein each of the plurality of channel structures further includes a metal-semiconductor compound layer between the first semiconductor material layer and the second semiconductor material layer, and
the first semiconductor material layer, the second semiconductor material layer, and the metal-semiconductor compound layer are electrically connected to each other.

* * * * *